(12) United States Patent
Pan et al.

(10) Patent No.: US 12,537,179 B2
(45) Date of Patent: Jan. 27, 2026

(54) CAPACITIVE SENSING DATA INTEGRATION FOR PLASMA CHAMBER CONDITION MONITORING

(71) Applicant: Applied Materials, Inc., Santa Clara, CA (US)

(72) Inventors: Yaoling Pan, San Jose, CA (US); Patrick John Tae, Palo Alto, CA (US); Michael D. Willwerth, Campbell, CA (US); Leonard Tedeschi, San Jose, CA (US); Kiyki-Shiy N Shang, Santa Clara, CA (US); Mikhail V. Taraboukhine, Pleasanton, CA (US); Charles R. Hardy, San Jose, CA (US); Sivasankar Nagarajan, Bangalore (IN)

(73) Assignee: Applied Materials, Inc., Santa Clara, CA (US)

( * ) Notice: Subject to any disclaimer, the term of this patent is extended or adjusted under 35 U.S.C. 154(b) by 408 days.

(21) Appl. No.: 18/071,444

(22) Filed: Nov. 29, 2022

(65) Prior Publication Data

US 2023/0103165 A1 Mar. 30, 2023
US 2023/0343568 A2 Oct. 26, 2023

Related U.S. Application Data

(62) Division of application No. 16/812,081, filed on Mar. 6, 2020, now Pat. No. 11,545,346.

(51) Int. Cl.
*H01J 37/32* (2006.01)
*G01N 27/22* (2006.01)

(52) U.S. Cl.
CPC ...... *H01J 37/32935* (2013.01); *G01N 27/228* (2013.01); *H01J 37/32807* (2013.01);
(Continued)

(58) Field of Classification Search
CPC .......... H01J 37/32935; H01J 37/32807; H01J 37/32853; H01J 37/32926;
(Continued)

(56) References Cited

U.S. PATENT DOCUMENTS 8,226,769 B2  7/2012  Matyushkin et al.
8,287,650 B2  10/2012  Lee et al.
(Continued)

FOREIGN PATENT DOCUMENTS

CN  102106192 A  6/2011
CN  109417039 A  3/2019
(Continued)

OTHER PUBLICATIONS

Notice of Reasons for Rejection from Japanese Patent Application No. 2022-552755 dated Dec. 25, 2023, 11 pgs.
(Continued)

*Primary Examiner* — David E Smith
(74) *Attorney, Agent, or Firm* — Schwabe, Williamson & Wyatt, P.C.

(57) ABSTRACT

Capacitive sensors and capacitive sensing data integration for plasma chamber condition monitoring are described. In an example, a plasma chamber monitoring system includes a plurality of capacitive sensors, a capacitance digital converter, and an applied process server coupled to the capacitance digital converter, the applied process server including a system software. The capacitance digital converter includes an isolation interface coupled to the plurality of capacitive sensors, a power supply coupled to the isolation interface, a field-programmable gate-array firmware coupled to the isolation interface, and an application-specific integrated circuit coupled to the field-programmable gate-array firmware.

10 Claims, 16 Drawing Sheets

(52) U.S. Cl.
CPC .. *H01J 37/32853* (2013.01); *H01J 37/32926* (2013.01); *H01J 2237/24495* (2013.01); *H01J 2237/24564* (2013.01); *H01J 2237/24592* (2013.01)

(58) Field of Classification Search
CPC ... H01J 2237/24495; H01J 2237/24564; H01J 2237/24592
See application file for complete search history.

(56) References Cited

U.S. PATENT DOCUMENTS

| | | | |
|---|---|---|---|
| 8,633,423 | B2 | 1/2014 | Lin et al. |
| 2005/0034811 | A1 | 2/2005 | Mahoney et al. |
| 2010/0100337 | A1 | 4/2010 | Vichare et al. |
| 2011/0128017 | A1 | 6/2011 | Booth et al. |
| 2011/0209915 | A1 | 9/2011 | Telfort et al. |
| 2013/0087286 | A1 | 4/2013 | Carducci et al. |
| 2017/0365531 | A1* | 12/2017 | Tedeschi .............. G01N 27/227 |
| 2020/0072594 | A1 | 3/2020 | Potter et al. |
| 2020/0139914 | A1 | 5/2020 | Ferring et al. |

FOREIGN PATENT DOCUMENTS

| | | | |
|---|---|---|---|
| JP | 2007502519 | A | 2/2007 |
| JP | 2007524091 | A | 8/2007 |
| JP | 2009010699 | A | 1/2009 |
| JP | 2009510699 | A | 3/2009 |
| JP | 2010129408 | A * | 6/2010 |
| JP | 2011-507195 | | 3/2011 |
| JP | 2012513872 | A | 6/2012 |
| JP | 2013512447 | A | 4/2013 |
| JP | 2014130319 | A | 7/2014 |
| JP | 2019-522900 | A | 8/2019 |
| KR | 20170054284 | A | 5/2017 |
| TW | 201429321 | | 7/2014 |
| TW | 201625968 | A | 7/2016 |
| TW | 201634917 | A | 10/2016 |
| WO | WO 2019-002140 | | 1/2019 |

OTHER PUBLICATIONS

Notice of First Office Action from Chinese Patent Application No. 2021180016547.9 dated Apr. 7, 2025, 16 pgs.
Official Letter from Taiwan Patent Application No. 112135453 dated Jan. 16, 2024, 7 pgs.
Official letter from Taiwan Patent Application No. 110102264 dated Jan. 4, 2023, 9 pgs.
Preliminary Rejection from Korean Patent Application No. 10-2022-7034459 dated Aug. 14, 2024, 8 pgs.
Notice of Reasons for Rejection from Japanese Patent Application No. 2024-107828 dated Jul. 22, 2025, 8 pgs.
International Search Report and Written Opinion from PCT Patent Application No. PCT/US2021/013717 dated May 12, 2021, 12 pgs.
International Preliminary Report on Patentability for Application No. PCT/US2021/013717 dated Sep. 15, 2022, 7 pgs.
Decision of Rejection from Japanese Patent Application No. 2024-107828 dated Dec. 2, 2025, 5 pgs.

* cited by examiner

Quadratic:

$C = at^2 + bt + c$

- $C_0 = c$
- $\tau = \dfrac{b}{2a}$
- $Cinf = c - \dfrac{b^2}{4a}$

Exponential:

$C = ae^{\frac{t}{b}} + c$

- $C_0 = a + c$
- $\tau = b$
- $Cinf = c$

CAPACITIVE SENSING DATA INTEGRATION FOR PLASMA CHAMBER CONDITION MONITORING

CROSS-REFERENCE TO RELATED APPLICATIONS

This application is a Divisional of U.S. patent application Ser. No. 16/812,081, filed on Mar. 6, 2020, the entire contents of which are hereby incorporated by reference herein.

BACKGROUND

1) Field

Embodiments of the present disclosure pertain to the field of plasma chamber condition monitoring and, in particular, to capacitive sensing data integration for plasma chamber condition monitoring.

2) Description of Related Art

The fabrication of microelectronic devices, display devices, micro-electromechanical systems (MEMS), and the like require the use of one or more processing chambers. For example, processing chambers such as, but not limited to, a plasma etch chamber, a plasma enhanced chemical vapor deposition chamber, a physical vapor deposition chamber, a plasma treatment chamber, or an ion implantation chamber may be used to fabricate various devices. As scaling continues to drive to smaller critical dimensions in such devices, the need for uniform processing conditions (e.g., uniformity across a single substrate, uniformity between different lots of substrates, and uniformity between chambers in a facility) is becoming more critical in high volume manufacturing (HVM) environments.

Processing non-uniformity arises from many different sources. One such source is the condition of the chamber itself. That is, as substrates are processed in a chamber, the chamber environment may change. For example, in an etching process, etch byproducts may be deposited on the interior surfaces of a chamber as a result of a redeposition process. The buildup of a redeposition layer on the interior surfaces of the chamber can alter the plasma chemistry in subsequent iterations of a process recipe and result in process drift.

To combat process drift, the processing chamber may be cleaned periodically. An in-situ chamber clean (ICC) may be implemented to reset the chamber condition. Currently, ICCs are primarily recipe based. That is, a set recipe is executed in order to clean the processing chamber. Some ICCs may use an optical emission spectrometry (OES) system for end-point determination of the process recipe. However, there is no way to directly measure the condition (e.g., the thickness of the redeposition layer, thickness of a seasoning layer, etc.) of interior surfaces of the processing chamber.

The processing chamber may also be opened in order to manually clean portions of the processing chamber or to replace worn consumables within the processing chamber. However, opening a processing chamber results in significant down time since the processing chamber needs to be pumped back down to the desired vacuum pressure, seasoned, and the chamber needs to be revalidated before production substrates can be processed. Opening of the processing chamber may occur at predetermined intervals (e.g., after a certain number of substrates have been processed) or after an excursion is detected. Relying on predetermined intervals may result in opening the chamber too often. As such, the throughput is decreased. In the case of excursion detection, correction of the chamber condition is made after damage to production substrates has already occurred. As such, yield is decreased.

SUMMARY

Embodiments of the present disclosure include capacitive sensing data integration for plasma chamber condition monitoring.

In an embodiment, a plasma chamber monitoring system includes a plurality of capacitive sensors, a capacitance digital converter, and an applied process server coupled to the capacitance digital converter, the applied process server including a system software. The capacitance digital converter includes an isolation interface coupled to the plurality of capacitive sensors, a power supply coupled to the isolation interface, a field-programmable gate-array firmware coupled to the isolation interface, and an application-specific integrated circuit coupled to the field-programmable gate-array firmware.

In another embodiment, an interconnect for a plasma chamber monitoring system includes a first connector for coupling to a capacitance digital converter of a capacitive sensor module, a second connector for coupling to an electronic and an external power supply, and a shielded cable coupled to and between the first connector and the second connector. The shielded cable includes a shielding metal for physically connecting the interconnect to a frame of a plasma chamber, a power supply line housed within the shielding metal, a ground line housed within the shielding metal, and one or more communication lines housed within the shielding metal.

In another embodiment, a method of integrating data for plasma chamber condition monitoring includes streaming data from a capacitive sensor module to a data server. The data includes capacitance data and temperature data. The method also includes collecting the data on an applied process server. The method also includes correlating the data to one or more process recipe operations. The method also includes synchronizing the capacitive sensor module with the one or more process recipe operations.

DETAILED DESCRIPTION

Figure 1:
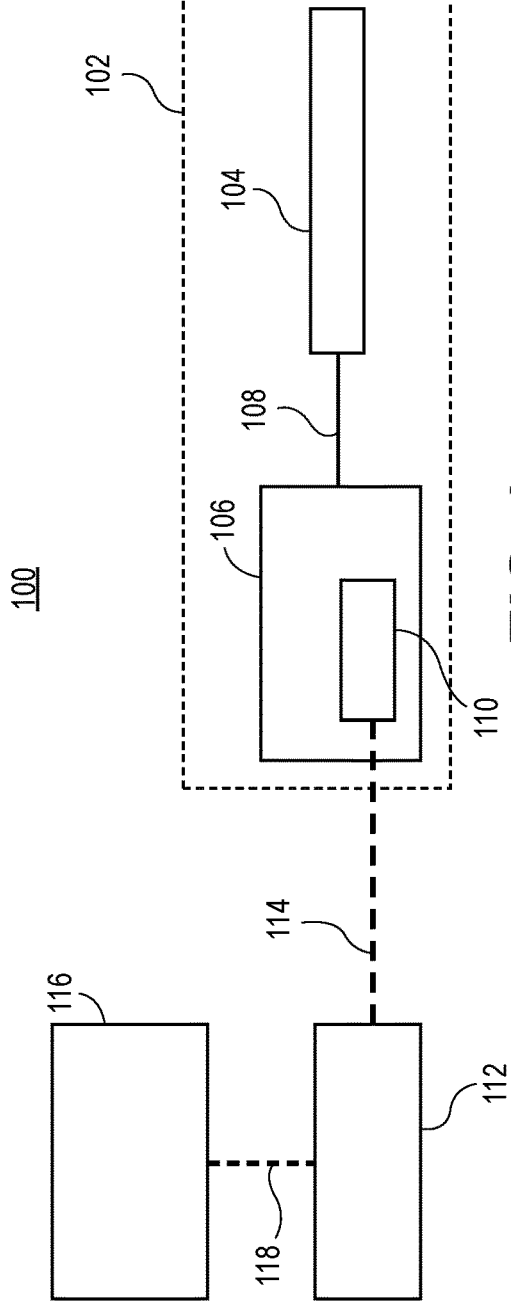
FIG. 1 is a schematic illustrating a conventional plasma chamber monitoring system.

Capacitive sensors and capacitive sensing data integration for plasma chamber condition monitoring are described. In the following description, numerous specific details are set forth, such as chamber configurations and capacitive sensor architectures, in order to provide a thorough understanding of embodiments of the present disclosure. It will be apparent to one skilled in the art that embodiments of the present disclosure may be practiced without these specific details. In other instances, well-known aspects, such as detailed chamber specifications, are not described in detail in order to not unnecessarily obscure embodiments of the present disclosure. Furthermore, it is to be understood that the various embodiments shown in the Figures are illustrative representations and are not necessarily drawn to scale.

One or more embodiments are directed to capacitive sensors and systems to monitor process chamber conditions. Embodiments may be applicable to or include data integration and process algorithms, strategic sensor locating in a process chamber, sensor structures and materials, electronics, data processing algorithms, and system integration of one or more sensors with a process tool.

In accordance with an embodiment of the present disclosure, sensors are used for chamber wall monitoring in one or more of at least four locations: a chamber wall, a chamber lid, in a sub-floor vacuum (SVF) port, and/or at an edge ring. Sensor module/housing structures and assembly described herein may be compatible with process temperature up to, e.g., 400 degrees Celsius. Particular embodiments can include capacitive wall sensors, on-chip thermal sensors, and/or sensors on substrates such as ceramic substrate.

To provide context, compared to other chamber wall monitoring approaches (e.g., optical, piezoelectric, RF impedance, etc.), the sensors and sensor locations disclosed herein enable measurement of capacitance changes (and, optionally, temperature) directly related to conditions such as wall deposition or cleaning at each operation of a process recipe for ICC optimization or chamber seasoning, as well as minimizing preventative maintenance (PM) frequency (e.g., >2x reduction). Embodiments may also enable prediction of process stability or drift to significantly improve productivity and yield in production.

Some embodiments involve the combination of two sensing technology implementations: capacitive sensors and thermal sensors, e.g., for chamber wall condition monitoring with high sensitivities and real time measurement. Embodiments involving sensors-on-substrate can be implemented to not only provide the benefits of sensor module miniaturization and signal integrity but also robust device performance as well as reliability. A data sync scheme as well as process algorithm can enable for direct feedback to process control.

In some embodiments, in-chamber sensors described herein can be used to measure by-product accumulation, optimize ICC routines, identify excursions, and/or provide for faster PM recovery. Some embodiments enable temperature measurement in locations where state-of the art approaches cannot perform temperature measurements. Implementation of embodiments described herein can enable chamber matching, optimization of seasoning procedures, identification of excursions, particle generation prediction, process performance prediction (e.g., etch rate and etch non-uniformity, etc.), PM prediction, ring erosion prediction for ring position compensation, process excursion prediction, measurement of wall absorption and desorption, fab excursion detection, and/or chamber baseline monitoring with mixing lots.

Embodiments described herein may involve data synchronization for sensor data. In one embodiment, data synchronization approaches described herein can be implemented to correlate sensor data, such a wall sensor data, with process information (such as process recipe operations) with a predefined integration time. In a particular such embodiment, the predefined integration time is on the scale of, e.g., 20 ms, 50 ms, 100 ms, etc. In one embodiment, data synchronization approaches described herein can be implemented to correlate the sensor data, such as wall sensor data, with other in-situ sensor data (e.g., optical emission spectroscopy (OES) data, pressure data, gas flow data, temperature data, radio frequency (RF) data, etc.). In one embodiment, data synchronization approaches described herein can be implemented to enable automatic data extraction from a wall (or other location) sensor for process characterization and process development. In one embodiment, data synchronization approaches described herein can be implemented to enable the establishment of new metrology with a wall sensor for process control and monitoring.

For comparative purposes, FIG. 1 is a schematic illustrating a conventional plasma chamber monitoring system 100. Referring to FIG. 1, the system 100 includes a capacitive sensor module 102 having a capacitance sensor 104 coupled to application specific electronics 106 by an interconnect 108. The application specific electronics 106 include a memory card 110, such as an SD card. Sensor data is delivered to an offline personal computer 112 by a manual procedure 114. A user interface 116 is coupled to the offline personal computer 112 by pathway 118.

With general reference again to FIG. 1, the conventional plasma chamber monitoring system 100 only supports one capacitance sensor per controller assembly. Data is captured and stored locally on removable media. There is no connection to a process control server. Also, data is moved manually to a process control server for offline analysis.

Figure 2A:
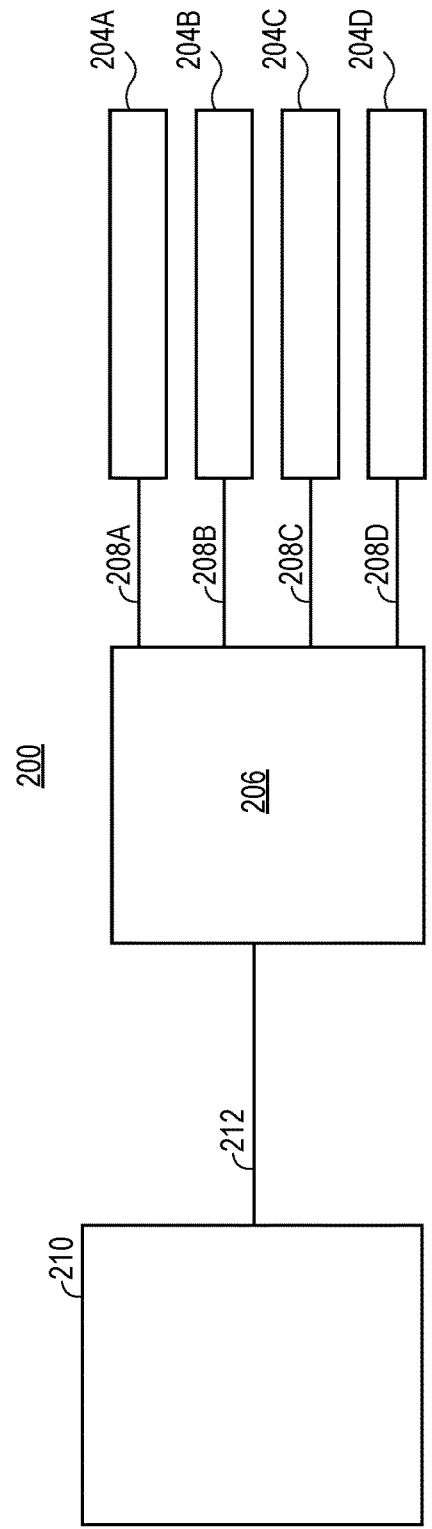
FIG. 2A is a schematic illustrating a plasma chamber monitoring system, in accordance with an embodiment of the present disclosure.

By contrast to FIG. 1, FIG. 2A is a schematic illustrating a plasma chamber monitoring system 200, in accordance with an embodiment of the present disclosure. Referring to FIG. 2A, the system 200 multiple capacitance sensors (e.g., an exemplary four sensors shown as 204A, 204B, 204C and 204D) coupled to application specific electronics 206 by a corresponding interconnect 208A, 208B, 208C or 208D. The application specific electronics 206 are coupled to a server 210 by an interconnect 212, such as an etherCAT line.

With general reference again to FIG. 2A, in an embodiment, the plasma chamber monitoring system 200 supports multiple capacitance sensors per controller assembly. Data is captured and transferred to a process server in real time, e.g., over etherCAT. The system 200 enables process recipe synchronization of capacitance sensor data with process recipe information and/or and other system sensors. In one embodiment, a data stream is from a sensor to a data server. In one embodiment, there is an interface (e.g., etherCAT) to external electronics controller and corresponding data processing unit. In one embodiment, sensor data is correlated to process information. In one embodiment, the system 200 can enable or perform operations such as data extraction, data processing, and/or data analysis.

System 200 can also perform and control sensor status. In an embodiment, the data server is able to condition and prime the sensor, to initialize the sensor, to reset the sensor, and/or to actively compensate the sensor drifting. In an embodiment, the data server is able to perform the data processing such as data denoising and regression, parameter extraction, and data modeling. The data server can also be implemented with algorithm for the machine learning with the sensor to predict and monitor process and chamber performance FIG. 2B is a schematic illustrating a plasma chamber monitoring system 250, in accordance with another embodiment of the present disclosure.

Figure 2B:
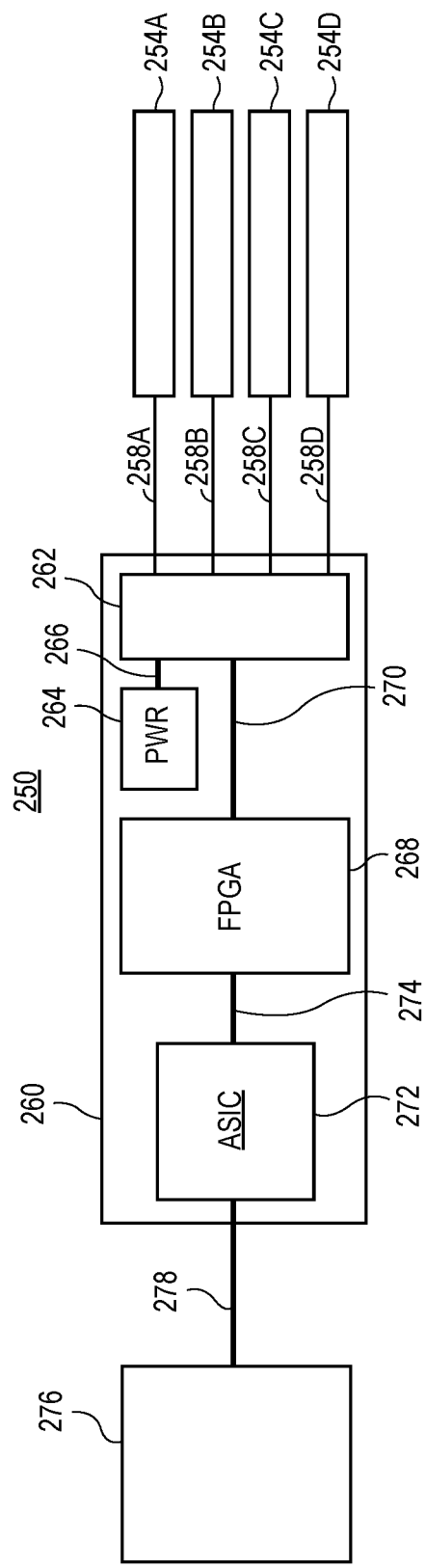
FIG. 2B is a schematic illustrating a plasma chamber monitoring system, in accordance with another embodiment of the present disclosure.

Referring to FIG. 2B, the plasma chamber monitoring system 250 includes a plurality of capacitive sensors with capacitance digital converters (CDC) (in the example show, four are illustrated as 254A, 254B, 254C and 254D; however, any suitable number of sensors may be used). The output of the CDCs are any format of digital data stream, for example, I2C, SPI, or UART. The plasma chamber monitoring system 250 can also include an applied process server 276 coupled to the capacitance digital converter outputs via electronics plugin module (EPM) 260. The applied process server 276 includes a system software. The EPM 260 includes an isolation interface 262 coupled to the plurality of outputs of CDC of capacitive sensors 254A, 254B, 254C and 254D, a power supply 265 coupled 266 to the isolation interface 262, a field-programmable gate-array (FPGA) firmware 268 coupled 270 to the isolation interface 262, and an application-specific integrated circuit (ASIC) 272 coupled 274 to the field-programmable gate-array firmware 268.

In one embodiment, the application-specific integrated circuit 272 of the EPM 260 is an etherCAT application-specific integrated circuit. In one such embodiment, the etherCAT application-specific integrated circuit provides for seamless integration of the system software and control of multiple ones of the plurality of capacitive sensors 254A, 254B, 254C and 254D simultaneously. In another such embodiment, the etherCAT application-specific integrated circuit initializes and calibrates individual ones of the plurality of capacitive sensors 254A, 254B, 254C and 254D. In one embodiment, the application-specific integrated circuit 272 of the EPM 260 is coupled 278 to the applied process server 276 by an etherCAT connection.

In one embodiment, the applied process server 276 synchronizes capacitance sensor data from the plurality of capacitive sensors 254A, 254B, 254C and 254D with a process recipe. In one embodiment, the field-programmable gate-array firmware 268 of the EPM 260 provides for deterministic timing and simultaneous communication with multiple ones of the plurality of capacitive sensors 254A, 254B, 254C and 254D.

In one embodiment, individual ones of the plurality of capacitive sensors 254A, 254B, 254C and 254D are coupled in parallel to the isolation interface 262 of the EPM 260, as is depicted. In one embodiment, individual ones of the plurality of capacitive sensors 254A, 254B, 254C and 254D are each coupled to the isolation interface 262 of the EPM 260 by an interconnect including an inter-integrated circuit bus (I2C, SPI, UART, etc.) and a power supply line.

With general reference again to FIG. 2B, in an embodiment, the applied process server of the plasma chamber monitoring system 250 synchronizes capacitance sensor data with process recipe and other system sensors to improve on-wafer results. In an embodiment, etherCAT device definition is customized to ensure seamless system software integration and control of multiple capacitance sensors simultaneously. In an embodiment, custom firmware on ECAT ASIC initializes and calibrates capacitance sensors to deliver fast integration time, high accuracy, and repeatable measurements. In an embodiment, the custom firmware is able to monitor the sensor drift (capacitance drifting, temperature drifting) as the feedback and to compensate the sensor drift with predetermined algorithm to reset the sensor. In an embodiment, custom FPGA firmware enables deterministic timing and simultaneous communication with multiple capacitance sensors. In an embodiment, power distribution and isolation design ensures high signal to noise (SNR) of capacitance sensor analog measurements and data communication robustness.

In another aspect, connectors are described for interfacing with a sensor module. Such connectors can route the power from EPM to a sensor. Such connectors can provide a common ground between a sensor and EPM. Such connectors can provide a data stream from a sensor to EPM. Such connectors can synchronize sensor data clocking. Such connectors can be used to provide hardware radio frequency (RF) earth grounding.

Figure 3:
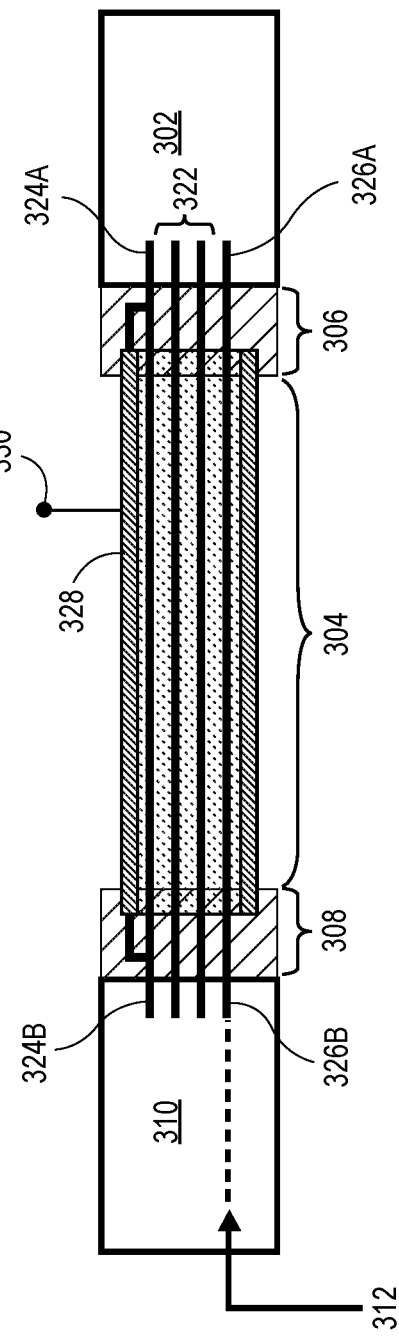
FIG. 3 illustrates an interconnect for a plasma chamber monitoring system, in accordance with an embodiment of the present disclosure.

As an exemplary connector, FIG. 3 illustrates an interconnect 300 for a plasma chamber monitoring system, in accordance with an embodiment of the present disclosure.

Referring to FIG. 3, the interconnect 300 includes a first connector 306 for coupling to a capacitance digital converter of a capacitive sensor module 302, a second connector 308 for coupling to EPM 310 and an external power supply 312

(such as a 5V DC power supply), and a shielded cable 304 coupled to and between the first connector 306 and the second connector 308. The shielded cable 304 includes a shielding metal 328, e.g., for physically connecting the interconnect 300 at location 330 to a frame of a plasma chamber. The shielded cable 304 also includes a power supply line (line from 326A to 326B) housed within the shielding metal 328, a ground line (line from 324A to 324B) housed within the shielding metal 328, and one or more communication lines 322 (two shown) housed within the shielding metal 328.

In one embodiment, the power supply line (line from 326A to 326B) housed within the shielding metal 328 is a 3-4 Volt power supply line. In one embodiment, each of the one or more communication lines 322 housed within the shielding metal 328 is or includes data bus (I2C, SPI, or UART)). In one embodiment, the ground line (line from 324A to 324B) housed within the shielding metal 328 provides a common ground for the capacitive sensor module 302 and the electronic 310. In one embodiment, the one or more communication lines 322 housed within the shielding metal 328 synchronize sensor data clocking.

In another aspect, a hardware implementation is described. As an exemplary implementation, FIG. 4 is a schematic illustrating a plasma chamber monitoring hardware 400, in accordance with another embodiment of the present disclosure.

Figure 4:
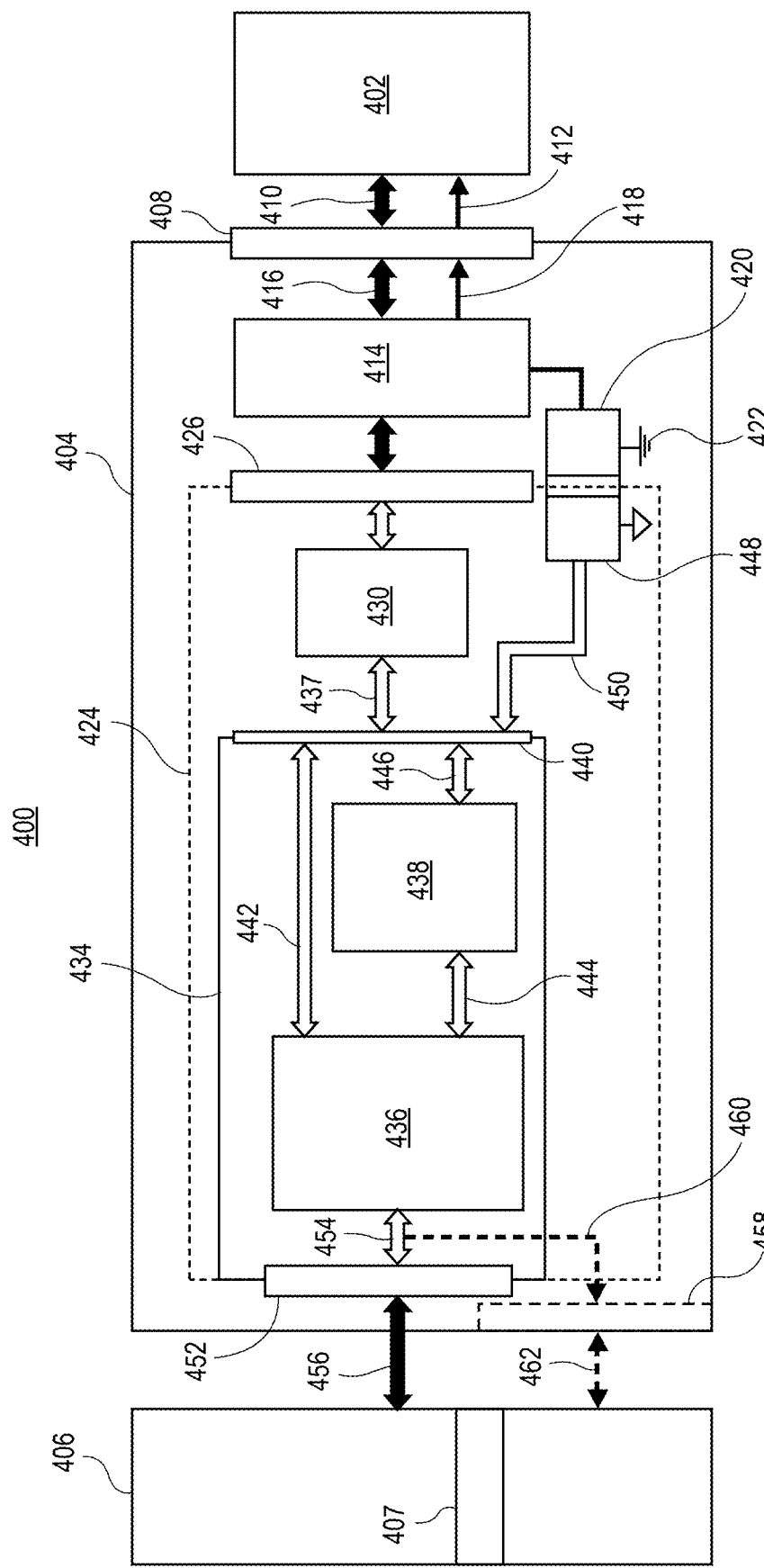
FIG. 4 is a schematic illustrating plasma chamber monitoring hardware, in accordance with another embodiment of the present disclosure.

Referring to FIG. 4, the plasma chamber monitoring hardware 400 includes a sensor ASIC 402 (such as a wall sensor ASIC), an application printed circuit board (PCB) 404, and an ether CAT master 406 which includes a device 407. The sensor ASIC 402 is coupled 410/412 to a connector (or connectors) 408 on the PCB 404. The connector (or connectors) 408 is coupled 416/418 to a power supply 414 on the PCB 404. The power supply 414 is coupled to a power source 420 (such as a 24V source) which is coupled to ground 422. The PCB 404 includes an isolation barrier 424. The power supply 414 is coupled 428 to an isolation 426 of the isolation barrier 424. The isolation 426 is coupled 432 to one or more application integrated circuits 430 on the isolation barrier 424. A second PCB 434 is included in the isolation barrier 424 of the application PCB 404. The second PCB 434 includes an etherCAT ASIC 436, an FPGA 438, and an isolation 440. The one or more application integrated circuits 430 of the isolation barrier 424 are coupled 437 to the isolation 440 of the second PCB 434. The etherCAT ASIC 436 is coupled 442 to the isolation 440 of the second PCB 434, and is coupled 444 to the FPGA 438. The FPGA 438 is also coupled 446 to the isolation 440 of the second PCB 434. A power supply 448 is coupled to the isolation 440 of the second PCB 434. The second PCB 434 also includes etherCAT connectors 452 coupled 454 to the etherCAT ASIC 436. The etherCAT connectors 452 of the second PCB are coupled to the etherCAT master 406, and can also be coupled 460 to additional etherCAT connectors 458 on the application PCB 404. If includes, the additional etherCAT connectors 458 can be coupled 462 to the etherCAT master 406, as is depicted.

With general reference again to FIG. 4, in an embodiment, an etherCAT plugin module includes an interface to a sensor with connectors with I2C or serial peripheral interface (SPI). In an embodiment, the hardware provides power supply to one or more sensors. In an embodiment, an FPGA and an ASIC are included for data streaming and data extraction control. In an embodiment, the hardware includes a firmware implementation for senor operation configuration and channel assignment. In an embodiment, the hardware includes an etherCAT (ECAT) process unit. In an embodiment, the hardware includes a connector to an ECAT master. In an embodiment, the hardware provides a grounding scheme for minimizing RF noise.

In an embodiment for system or hardware implementations described herein, basic configurations can include one or more of (1) channel configuration and reconfiguration including multi-channel capabilities, (2) each sensor can be operated individually or all sensors can be tied together, which may be dependent upon or controlled by software command, and/or (3) input/output channel reconfigurations including temperature channel control (e.g., for an external thermal sensor), clock (CLK) control (e.g., double conversion time), and/or capacitor conversion time control.

In an embodiment for software implementations described herein, requirements can include one or more of (1) data streaming from a sensor to a data server, sensor data collection on the server, correlation to process sequences, and sensor synchronization with manufacturing processes, (2) data processing and parametric extraction which can include data filtering (e.g., sensor data filtering and denoising), sensor data regression modeling, sensor parameter extraction, and process report generation, (3) sensor operation control with (a) a start-up operation mode which can reset a power cycle, plug-in sensor, provide sensor initialization, read the data and validate sensor status, and/or output capacitance (pF) and temperature (degrees) values, (b) a production mode which can synchronize with recipes, stream capacitance and temperature data before a process recipe starts (e.g., to provide data buffer time), provide a time stamp to be consistent with process recipe time, and/or enable data collection during tool idle, (c) engineering modes which can manually determine data stream and data logging, (d) executing calibration and/or offset correction, (e) compensate parasitic capacitance (e.g., by system offset calibration and/or gain factor calibration), (f) effect drifting compensation (zero-in), and/or (g) execute data collection through data streaming and storage.

In accordance with one or more embodiments described herein, a sensor produces two types of traces: capacitance and temperature. In one embodiment, for an engineering use case, the raw data for both capacitance and temperature is saved as unmodified in a server. Data collection is synchronized with a process sequence during the processing. Data collection can be performed during an idle state. The data stream during idle state can be used as the baseline of capacitive sensors for calibration, compensation, and resetting. In addition the data stream during idle state is also used to monitor chamber baseline condition as well as detect excursion in the chamber. The data is further processed and reported. In one embodiment, for a production use case, a temperature trace is saved. The temperature trace is also processed, and a capacitance trace is processed.

In accordance with one or more embodiments described herein, data processing such as filtering and denoising involves (1) moving average (N~2) calculations which may be based on the equation:

$$Y_j = \frac{\sum_{i=1}^{N+1} X_j(t = tj)}{N};$$

j=1, 2, 3, 4, and/or (2) parameter(s) extraction which can include regression modeling, data extraction and filtering (from a sensor module), data report generation (capacitance versus time/process operations), and/or use of temperature data (versus time/process operations).

In accordance with one or more embodiments described herein, a data processing flow (which can include the use of data processing algorithms) can involve (1) data (capacitance and temperature) stream and collection for states such as plasma off, plasma on, and an idle state, (2) data filtering by recipe (e.g., plasma off) and/or by denoising processes (e.g., moving average), (3) data fitting which can involve the use of regression models, model fitting, parameter extraction, and/or data output algorithms, and/or (4) process feedback for process control.

In another aspect, an exemplary implementation of data integration for capacitance sensor data (which can include temperature data as well, in some embodiments) is described based on an exemplary data set.

Figure 5A:
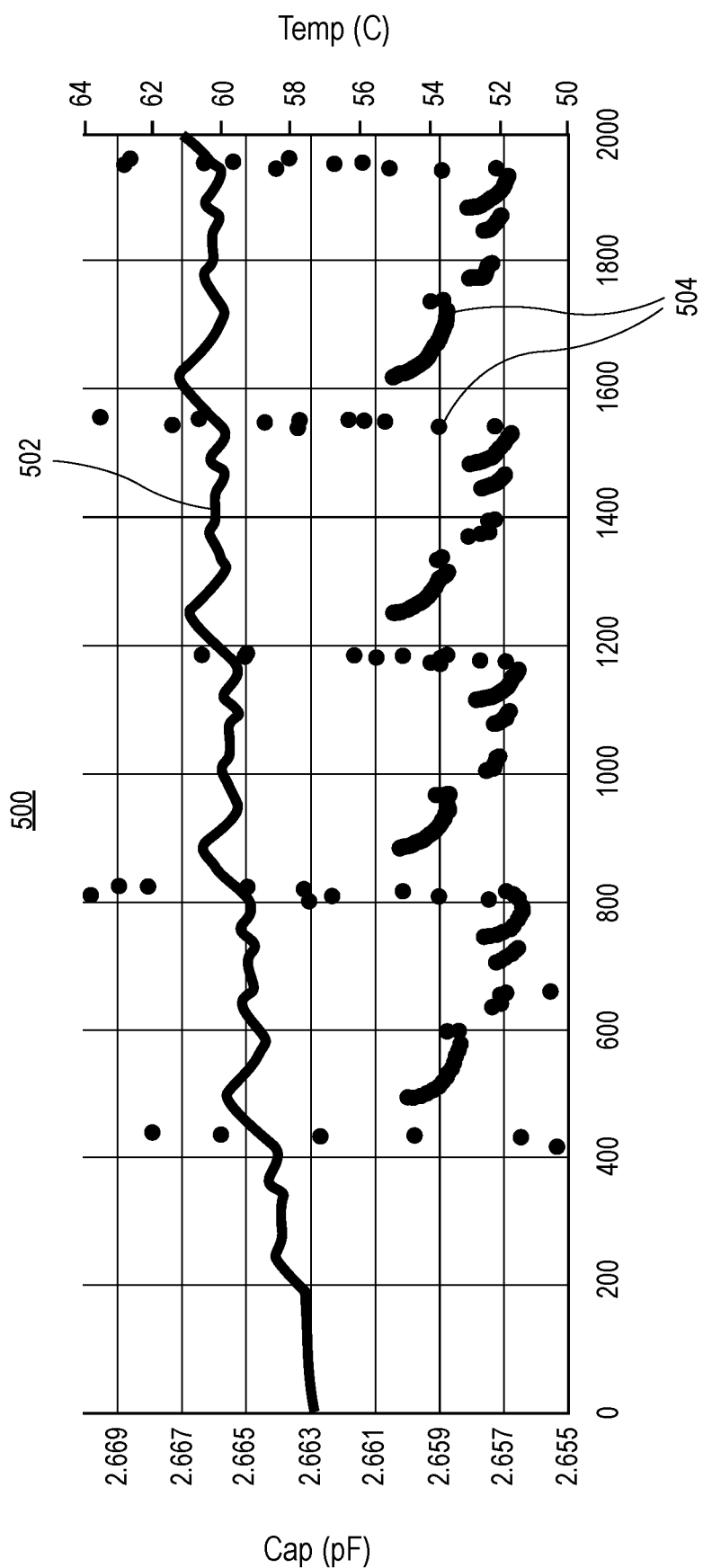
FIG. 5A is a plot of capacitance and temperature data including signal data and noise, in accordance with an embodiment of the present disclosure.

FIG. 5A is a plot 500 of capacitance and temperature data including signal data for temperature 502 and capacitance 504, in accordance with an embodiment of the present disclosure. The capacitance and temperature data of plot 500 can be raw capacitance and temperature data provided to a server.

Figure 5B:
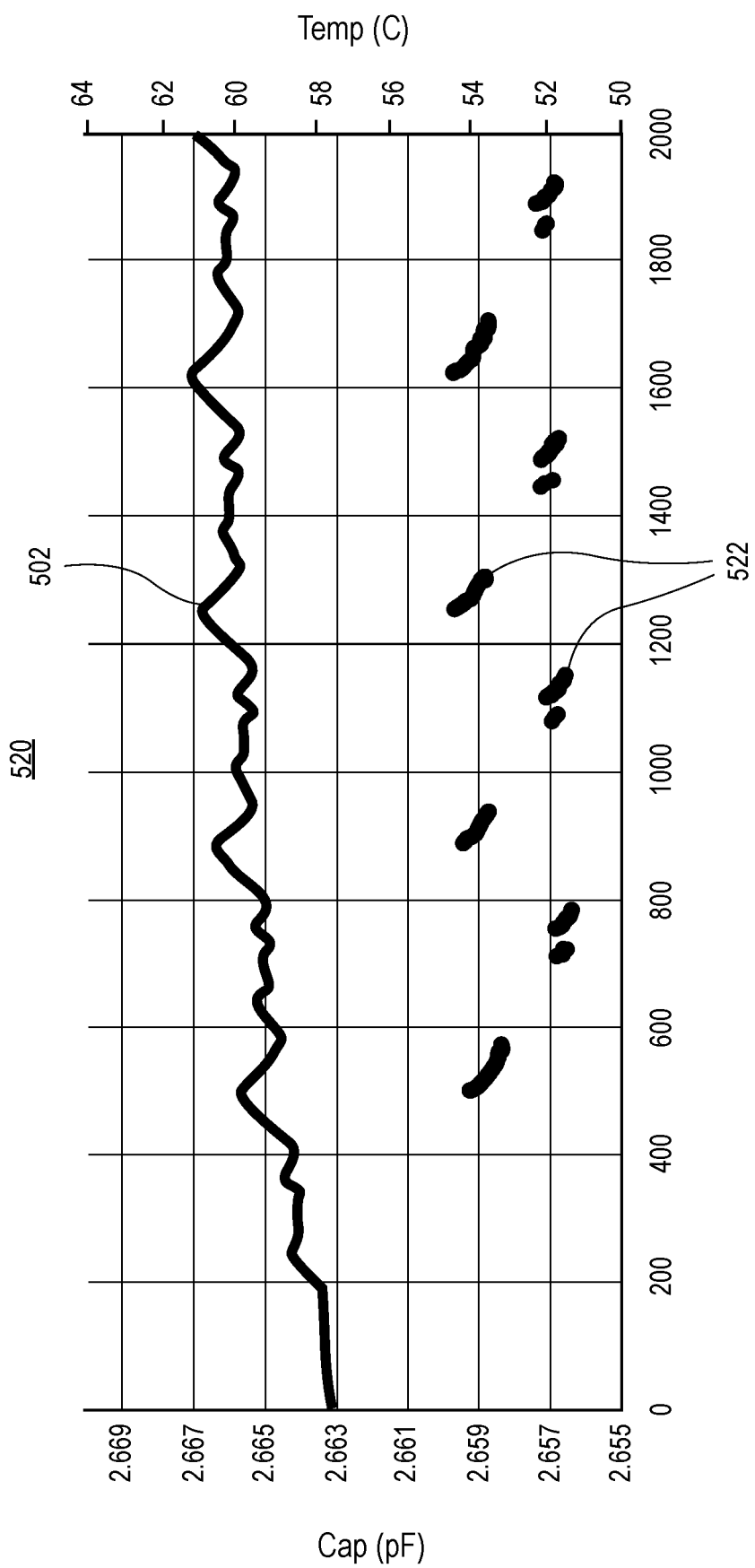
FIG. 5B is a plot of the capacitance and temperature data of the plot of FIG. 5A following a filtering operation, in accordance with an embodiment of the present disclosure.

FIG. 5B is a plot 520 of the capacitance and temperature data of plot 500 following a filtering operation, in accordance with an embodiment of the present disclosure. The capacitance and temperature data of plot 520 includes the temperature data 502 and denoised capacitance data 522. The resulting filtering traces can be based on an RF power setpoint.

Figure 5C:
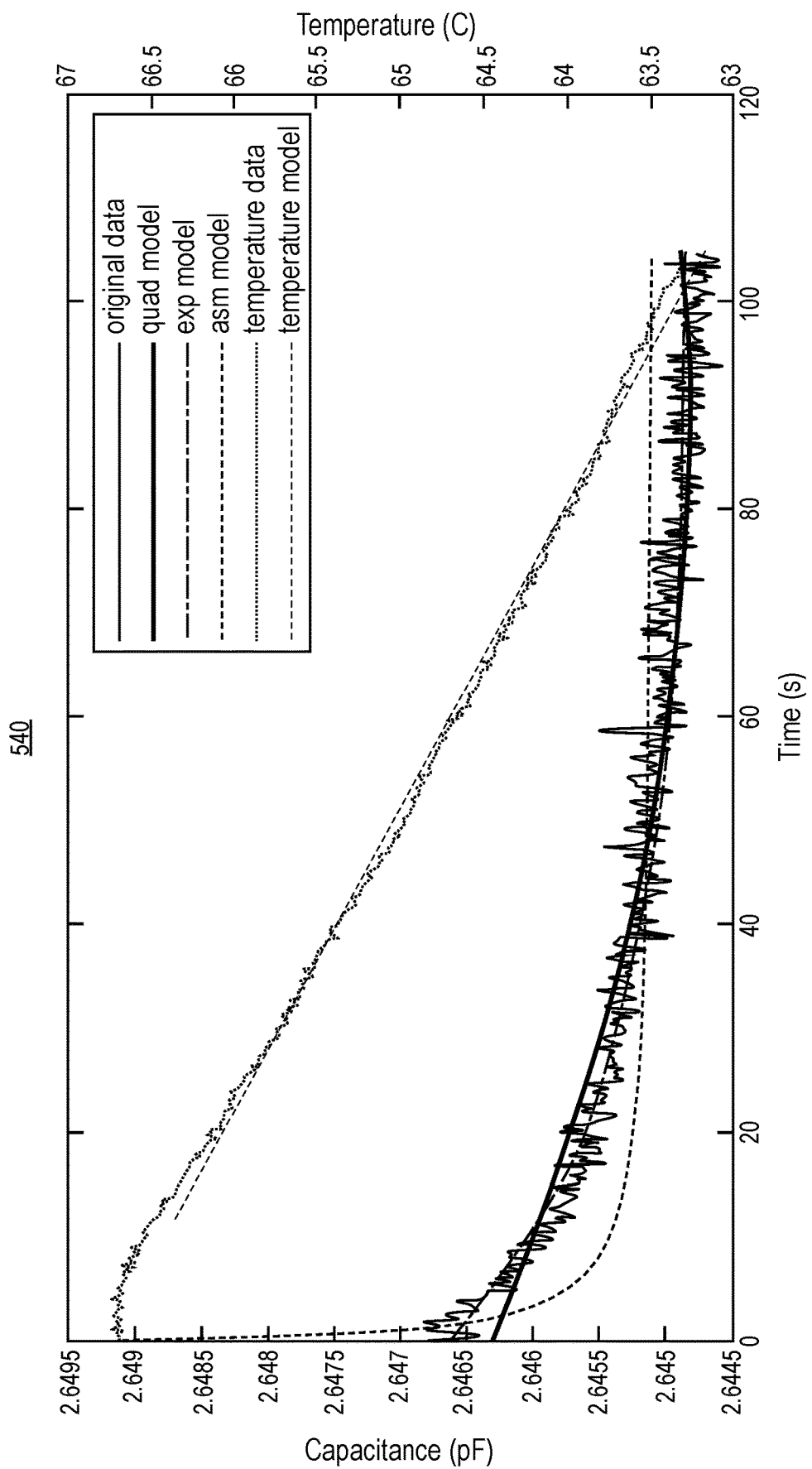
FIG. 5C is a plot of the capacitance and temperature data of the plot of FIG. 5B following data processing and fitting, in accordance with an embodiment of the present disclosure.

FIG. 5C is a plot 540 of the capacitance and temperature data of plot 520 following data processing and fitting, in accordance with an embodiment of the present disclosure. In one embodiment, the individual capacitance and temperature traces can be fit using previously applicable models. Data can be output by associating parameters extracted from traces with a recipe operation, recording fitting parameters with associated process recipe operations, and/or by generating data plots (e.g., extracted parameters versus process time or operations). Process feedback control can be implemented by monitoring the above parameters for outlier detection, drift, etch rate (ER)/process control (PC)/other sensor data, etc. The data can be used to provide a visual indicator of wall clean/dirty status for a plasma process chamber.

Figure 6:
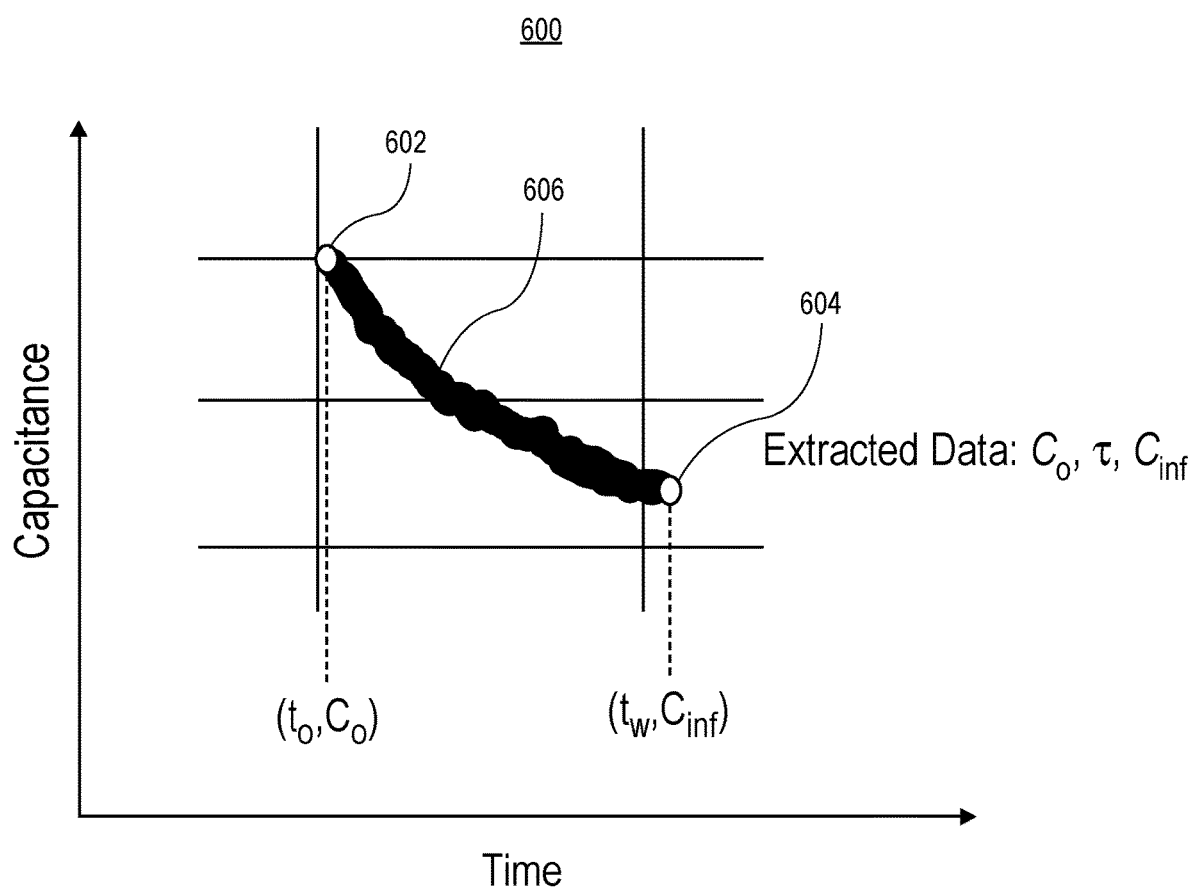
FIG. 6 is a plot of capacitance parameter definition, in accordance with an embodiment of the present disclosure.

FIG. 6 is a plot 600 of capacitance parameter definition, in accordance with an embodiment of the present disclosure. Referring to FIG. 6, in an embodiment, capacitance data is when plasma is off, e.g., data 606 in a range from a plasma off event 602 to a plasma on even 604. Traces, such as 606, are extracted in between plasma events, as defined by recipe setpoints. The trace data processes and parameters are extracted. The extracted parameters can be associated with the preceding step/recipe/operation. In one embodiment, trace length=$t_w-t_o$, where xs<Trace length<ys. If trace length is less than xs, it is ignored. If trace length is greater than ys, it can be truncated to include only the first ys.

In an embodiment, capacitance parametric extraction/regression models can include first order parameters: Capacitance baseline: $C_{base}$; Capacitance change: $\Delta Ci=C_{inf}-C_{base}$; Capacitance drift during plasma off: $\Delta Coff=C_o-C_{inf}$; average Capacitance during plasma off (e.g., for determining dep/clean amount): $C_{ave}$=mean [$C_o$: $C_w$]-$C_{base}$, where $\Delta C$, $C_{ave}$ are recorded.

Figure 7A:
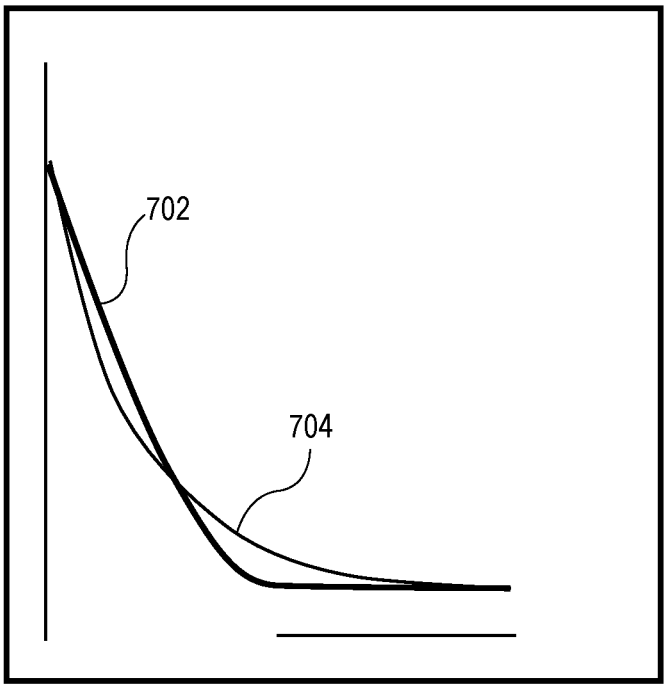
FIG. 7A is a plot of higher order regression fits, such as a quadratic fit and an exponential fit, in accordance with an embodiment of the present disclosure.

FIG. 7A is a plot 700 of higher order regression fits, such as a quadratic fit 702 and an exponential fit 704, in accordance with an embodiment of the present disclosure. A regression process can involve (1) extracting the fitting parameters by regression processes, (2) deducing $C_o$, t, and $C_{inf}$ from the fitting parameters, and (3) recording $C_o$, t, $C_{inf}$, and $R_2$.

Figure 7B:
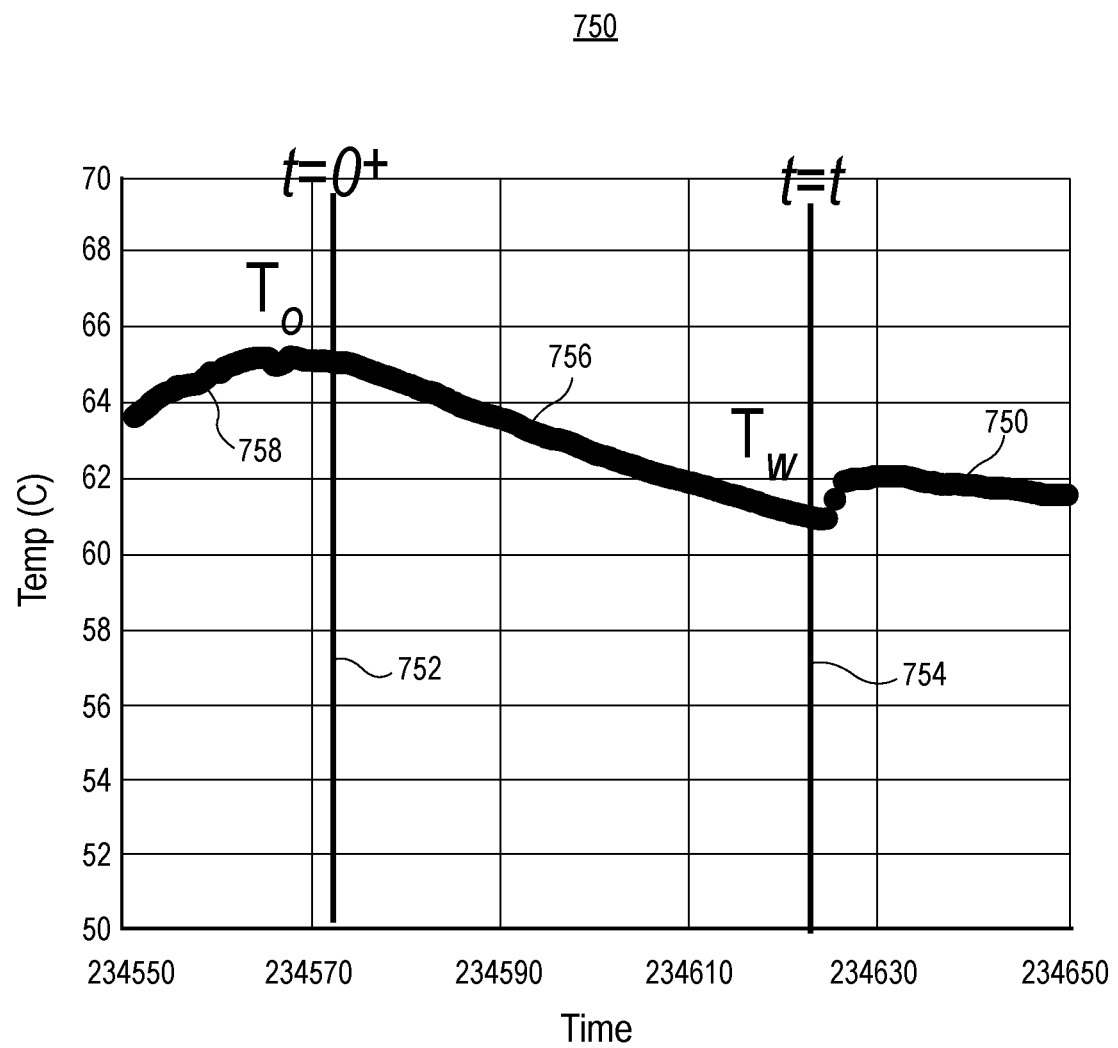
FIG. 7B is a plot of exemplary data from a temperature parametric extraction/regression model, in accordance with an embodiment of the present disclosure.

FIG. 7B is a plot 750 of exemplary data from a temperature parametric extraction/regression model, in accordance with an embodiment of the present disclosure. A temperature parametric extraction/regression process can involve (1) extracting the temperature trace corresponding to the same time as the capacitance trace defined above: trace length (756, excluding portions 758 and 760)=$t_w$; ignore if trace length <zs, but if trace length greater than zs, truncate to include only the first zs, (2) fitting with a linear model: Temperature=M*time+$T_o$, and (3) recording M, $T_o$ (752) and $T_w$ (754).

Figure 8:
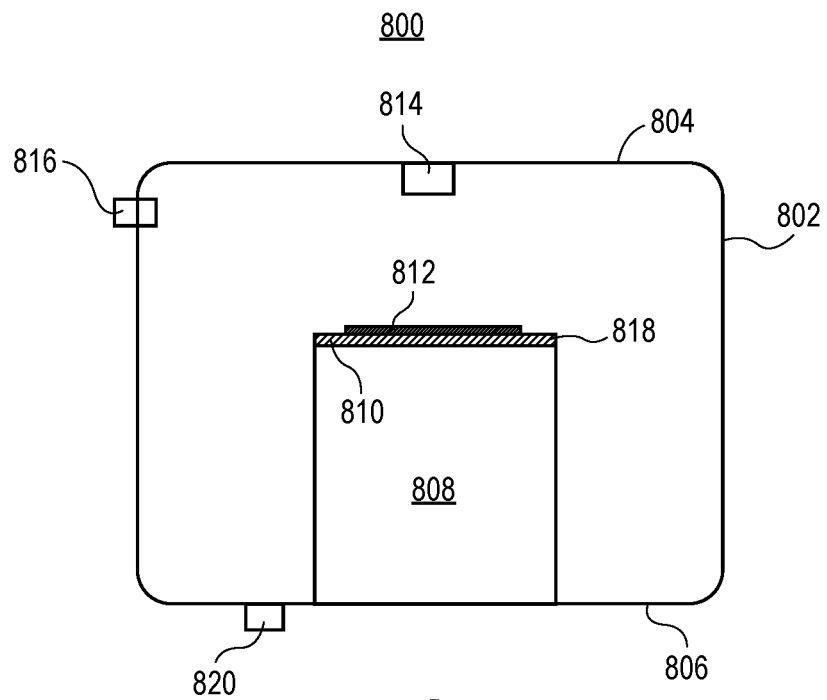
FIG. 8 illustrates a cross-section view of a plasma processing chamber including one or more capacitive sensors, in accordance with an embodiment of the present disclosure.

FIG. 8 illustrates a cross-section view of a plasma processing chamber including one or more capacitive sensors, in accordance with an embodiment of the present disclosure.

Referring to FIG. 8, a plasma processing chamber 800 includes a chamber wall 802 surrounding a processing region 811. A wafer or substrate 812 can be processed in the processing region 811. A chamber lid 804 is over the chamber wall 802, the chamber lid 804 above the processing region 811. A chamber floor 806 is beneath the chamber wall 802, the chamber floor 806 below the processing region 811. A support pedestal 808 is in the processing region 811 (and, more particularly, can include a support surface 810 in the processing region 811). The support pedestal 808 is below the chamber lid 804 and above the chamber floor 806, and is surrounded by the chamber wall 804.

Referring again to FIG. 8, in an embodiment, the chamber 804 wall has an opening there through. A capacitive sensor module 816 is in the opening of the chamber wall 804. In another embodiment, the chamber lid 804 includes a capacitive sensor module 814. In another embodiment, the chamber floor 806 includes an evacuation port. A capacitive sensor module 820 is within or adjacent to the evacuation port. In another embodiment, the support pedestal includes a ring structure (e.g., at location 818) surrounding a substrate support region. The ring structure includes an opening there through. A capacitive sensor module is in the opening of the ring structure. In an embodiment, a plasma processing chamber 800 includes one or more of a capacitive sensor module 816 is in the opening of the chamber wall 804, a capacitive sensor module 814 in the chamber lid 804, a capacitive sensor module within or adjacent to an evacuation port 820 of the chamber floor 806, and/or a capacitive sensor module is in the opening of the ring structure, e.g., at location 818.

Figure 9:
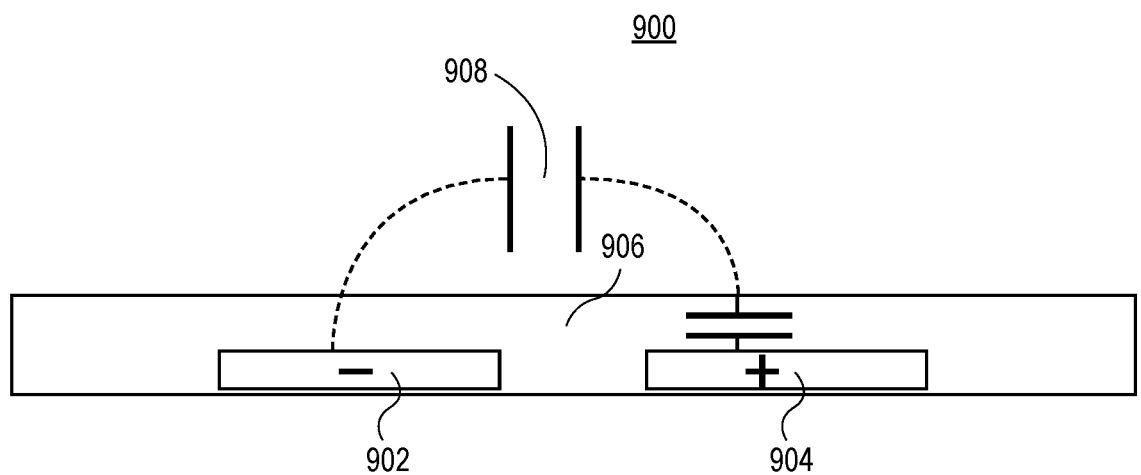
FIG. 9 is a schematic illustrating a cross-section view of a capacitive sensor, in accordance with an embodiment of the present disclosure.

FIG. 9 is a schematic illustrating a cross-section view of a capacitive sensor, in accordance with an embodiment of the present disclosure.

Referring to FIG. 9, a capacitive sensor module 900 includes a drive electrode 904 and a sense electrode 902. A measured capacitance 908 of a material 906 between the drive electrode 904 and the sense electrode 902 can vary as the composition, thickness, etc., of the material 906 changes or is varied. Material 906 represents, in one embodiment, a material for deposition on a wafer or substrate in a process chamber. Although the intent may be to remove/evacuate such excess material 906 that is not deposited on the wafer or substrate, some of the material 906 can accumulate in the process chamber and, ultimately, on a capacitive sensor module 900 in the process chamber. In another embodiment, in one embodiment, material 906 represents an etch by-product formed while etching wafer or substrate in a process chamber. Although the intent may be to remove/evacuate such etch by-product 906, some of the etch by-product 906 can accumulate in the process chamber and, ultimately, on a capacitive sensor module 900 in the process chamber.

A sensor system can include a sensor module, interface electronics, a controller, and integration with chamber data server for process control and data/process synchronization. As an example, FIG. 10 is a schematic illustrating a sensor system including a sensor module having a capacitive sensor, in accordance with an embodiment of the present disclosure.

Figure 10:
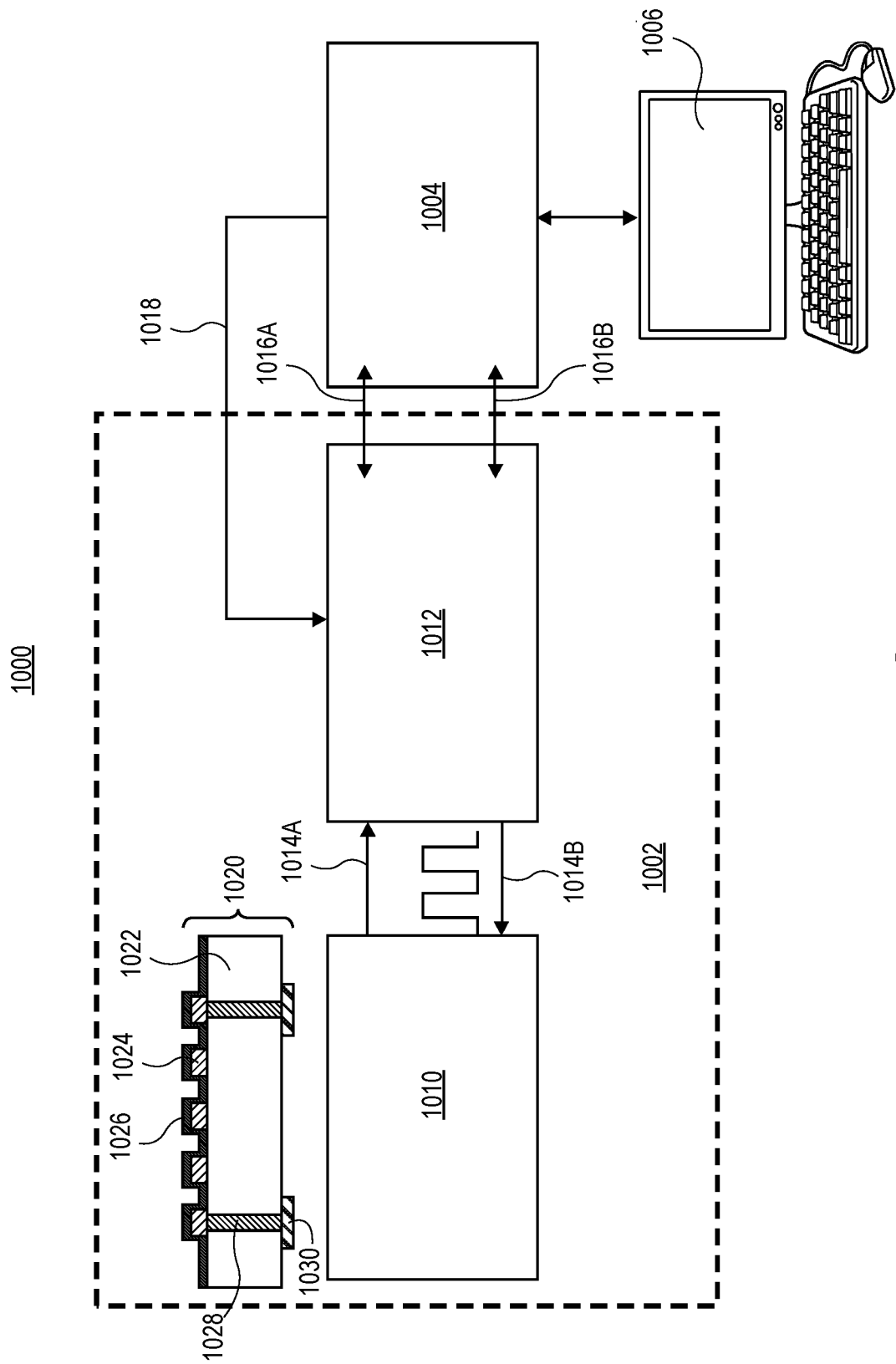
FIG. 10 is a schematic illustrating a sensor system including a sensor module having a capacitive sensor, in accordance with an embodiment of the present disclosure.

Referring to FIG. 10, a sensor system includes a sensor module 1002 coupled to a controller 1004 which in turn is coupled to a user interface 1006. The sensor module 1002 includes a capacitive sensor (shown schematically as 1010, or structurally as 1020). The capacitive sensor 1010 is coupled to a capacitance digital converter (CDC) interface circuit 1012. Communication internal to the module 1002 can be from the capacitive sensor 1010 to the CDC interface circuit 1012 along pathway 1014A, and/or can be from the CDC interface circuit 1012 to the capacitive sensor 1010 along pathway 1014B. Communication external to the module 1002 can be along pathways 1016A and 1016B between the CDC interface circuit 1012 and the controller 1004. The controller 1004 can be coupled to the CDC interface circuit 1012 by Vdd 1018.

Referring again to FIG. 10, a cross-sectional illustration of a sensor 1020 is shown, in accordance with an embodiment. In an embodiment, the sensor 1020 includes a substrate 1022 with electrodes 1024 disposed over the substrate 1022. In an embodiment, the electrodes 1024 are or include conductive materials that are compatible with microelectronic processing operations. For example, the material for the electrodes 1024 may include, but is not limited to, aluminum, molybdenum, tungsten, titanium, nickel, chromium, and alloys thereof.

In an embodiment, the electrodes 1024 are electrically coupled to pads 1030 on the backside of the substrate 1022 by conductive paths 1028 through the substrate 1022. For example, the conductive paths 1028 may include one or more vias, traces, and the like. In an embodiment, the conductive paths 1028 embedded in the substrate 1022 include conductive materials, such as, but not limited to, tungsten, molybdenum, titanium, tantalum, alloys thereof, and the like. In an embodiment, the pads 1030 include materials, such as, but not limited to titanium, nickel, palladium, copper, and the like. In some embodiments, pads 1030 are multi-layer stacks to improve integration with the CDC. For example, pads 1030 may include stacks such as titanium/nickel/palladium, titanium/copper/palladium, or other material stacks commonly used for interconnect pads.

In an embodiment, electrodes 1024 and a top surface of the substrate 1022 are covered by a layer 1026 (e.g., a barrier layer). In an embodiment, the overlying layer 1026 is a material that is resistant to plasma chemical species attack or erosion and limits diffusion. In the particular case of an etching chamber, a common etchant that is used is fluorine. As such, the layer 1026 used in such conditions should be resistant to fluorine etchants. In the particular embodiment of a plasma chamber used for etching, the layer 1022 may include one or more of a metallic oxide, a metallic fluoride, and a metallic oxyfluoride. The layer 1022 may include materials, such as, but not limited to, aluminum oxide, magnesium oxide, yttrium oxyfluoride, yttrium zirconium oxyfluoride, yttrium aluminum oxide, or hafnium oxide.

In an embodiment, the substrate 1022 includes a suitable substrate material that is resistant to processing conditions within the processing chamber (e.g., etching conditions). The substrate 1022 may be a ceramic material, a glass, or other insulating materials. In some embodiments, the substrate 1022 is a flexible substrate, such as a polymeric material. For example, the substrate 1022 may include materials, such as, but not limited to, silicon, silicon oxide, aluminum oxide, aluminum nitride, plastics, or other insulating materials. In order to allow for manufacture of a high volume of the sensors, the substrate 1022 may be a material that is compatible with high volume manufacturing (HVM) processes. That is, the substrate 1022 may be a material that is available in panel form, wafer form, or the like.

In accordance with an embodiment of the present disclosure, both a capacitive sensor and a thermal sensor are integrated (embedded) into one sensor module. In one such embodiment, a wall sensor module includes a capacitive sensor, a CDC, and a thermal sensor and a housing unit to assemble the capacitive sensor, the CDC, and the thermal sensor together.

With reference again to FIG. 10, in an embodiment, a thermal sensor is disposed on the substrate 1022. For example, the thermal sensor may be formed over a backside surface of the substrate 1022 (i.e., on the opposite surface from the electrodes 1024). The thermal sensor may include any suitable sensing technology. For example, the thermal sensor can include a plurality of traces to form a resistive temperature detector (RTD). However, it is to be appreciated that other thermal sensors, such as, but not limited to, a thermocouple (TC) sensor, or thermistor (TR) sensor, or optical thermal sensor, may be used. In the one embodiment, the thermal sensor is integrated directly on the substrate 1022. However, it is to be appreciated that in some embodiments, a discrete component including a thermal sensor may be mounted to the substrate 1022. In other embodiments, a thermal sensor may be integrated into a CDC that is attached to the sensor 1020.

In accordance with one or more embodiments of the present disclosure, a method of integrating data for plasma chamber condition monitoring includes streaming data from a capacitive sensor module to a data server. The data includes capacitance data and temperature data. The method also includes collecting the data on an applied process server. The method also includes correlating the data to one or more process recipe operations. The method also includes synchronizing the capacitive sensor module with the one or more process recipe operations.

In an embodiment, the method of integrating data for plasma chamber condition monitoring further incudes, subsequent to collecting the data on the applied process server and prior to correlating the data to one or more process recipe operations, performing data processing and parametric extraction. In one such embodiment, performing the data processing includes filtering the data and denoising the data. In a specific such embodiment, filtering the data and denoising the data includes using a moving average approach. In another such embodiment, performing the data processing and the parametric extraction includes regression modeling of the data.

In an embodiment, the method of integrating data for plasma chamber condition monitoring further includes monitoring one or more parameters of the one or more process recipe operations with the capacitive sensor module. In one such embodiment, the method further includes determining a clean/dirty status for a plasma chamber based on the monitoring of the one or more parameters of the one or more process recipe operations with the capacitive sensor module.

Wall/Lid Sensor Solutions

The following are exemplary parameters and corresponding (a) importance, (b) solution and (c) benefit/use.

Wall and lid temperature: (a) first wafer(s) effects (critical dimension (CD) and etch rate (ER)), particles, coefficient of thermal expansion (CTE); (b) thermometer on back of sensor; (c) accurate measurement of temperature in situ. ICC can be triggered to bring walls/lid to target temperature.

Chamber condition: (a) first wafer(s) effects, long term ER/CD drift, preventative maintenance (PM) recovery, process step by step stability; (b) directly detect deposition and removal, outgassing monitoring; (c) monitor chamber condition after each wafer/ICC and each step, process stability, reduced PM, faster time to identify and solve drift issues.

Excursion detection (e.g., back stream): (a) unknown yield killers, process shift; (b) constantly measuring, can detect shifts in chamber condition; (c) detect the residual species absorption and desorption.

Mix running (more/less by product): (a) influences chamber condition; (b) directly detect deposition and its removal; (c) monitor the chamber wall conditions for optimal recipe or lot sequence to minimize process cross-talk.

ICC Optimization: (a) process chamber (PC)/ER/CD stability; (b) directly detect deposition and its removal; (c) detect inefficient ICC and develop optimal ICC recipe in situ, monitor liner/chamber wall conditions for optimal surface protection of chamber wall/liner for conduct etch (e.g., $BCl_3/Cl_2$ based etch) processes.

Capacitance Sensor Solutions

The following are exemplary parameters and corresponding (a) importance, (b) solution and (c) benefit/use.

Deposition on single ring: (a) particles; (b) install cap sensor into single ring; (c) develop more effective ICCs without coupons, end point periodic cleans.

Single Ring erosion monitor: (a) ring erosion; (c) determine when ring needs to be changed, assist to automatically set ring height.

RF on by product monitor: (a) additional method of catching end point detection (EPD), particles; (b) install cap sensor in lower chamber near SFV; (c) detect when etch punches through one film into next, determine by product in lower chamber.

Wear rate on parts (time to break): (a) quickly determine impact of process changes to MTBC; (b) develop sensors of made chamber materials installed on parts in specific locations; (c) quickly determine the impact process changes on parts to calculate MTBC.

Residual chemical reaction sensor (on wafers): (a) queue time; (b) build sensors into test wafers to measure chemical reactions post process; (c) understand queue times and process optimization to reduce/eliminate residual chemical reactions.

PVD/CVD/ALD chamber wall: (a) chamber wall cleaning and seasoning; (b) install sensor onto specific location to monitor wall condition; (c) in situ monitoring of chamber wall.

Case Studies

The following are exemplary issues and corresponding (a) impact, and (b) wall/lid sensor detection solutions to mitigate or eliminate impact.

CD impact due to lid/wall temp after some idle time (due to fault or other delay): (a) 1-3 wafers scrapped; (b) sensors automatically detect temperature out of specification and call warm up procedure.

Non-optimized warm up procedure: (a) lost production time; (b) end point detection (EPD) warm up/season procedure.

Backstream event (e.g., backing pump fails): (a) wafer scrap due to chamber condition shift; (b) automatically detects change in wall/lid condition.

Fab excursion (e.g., power glitch): (a) wafer scrap, requalification, PMs needed; (b) determine which chambers have issues without running etch rate (ER) monitors.

Recipes that exceed lid thermal budget: (a) broken lids, wafers scrapped, PMs needed; (b) fault chamber if lid temp exceeds specification.

Non-optimized ICC, monitor wafer runs impacting chamber condition: (a) shorter MTBC, extended season, ICC, yield loss; (b) detects and monitors wall/lid condition.

Plasma stability: (a) yield loss; (b) detect changes in capacitance at high speed (e.g., 50 hz).

Converting from application A to B: (a) over/under season (e.g., lost production time/first wafer effects); (b) determine when chamber is ready for production.

In an embodiment, a capacitive sensor assembly (or sensor assembly) includes a sensor module and a sensor housing assembly. The sensor module may include a capacitor (e.g., a first electrode and a second electrode) that is disposed over a substrate. The sensor module may also include a capacitance-to-digital converter (CDC) for converting the capacitance output from the capacitor into a digital signal for subsequent processing. In order to integrate the sensor module with the processing tool, a sensor housing assembly may be used to house the sensor module. The sensor housing assembly can include features to secure the sensor module within the processing chamber while allowing the capacitor of the sensor module to be exposed to the processing environment. The sensor housing assembly may also include components for interfacing with ports through a chamber wall or a chamber lid of the processing tool in order to allow for data to be captured in real time.

In a particular embodiment, the sensor housing assembly includes a hollow shaft and a cap. The sensor module may be secured against an end of the shaft by the cap. A hole through the cap exposes the capacitor of the sensor module. The hollow shaft allows for interconnects (e.g., wires, pins, etc.) from the sensor module to be protected from the processing environment and fed to a vacuum electrical feedthrough in order to exit the chamber without disrupting the chamber vacuum.

Different locations for the sensor module may be implemented by making modifications to the various components of the sensor housing assembly and/or by modifying how the components interface with the chamber itself. For example, in the case of a chamber wall sensor, the shaft may extend through a port in the chamber wall and the vacuum electrical feedthrough may be external to the chamber. In the case of a lid sensor, the shaft may extend out from the lid into the chamber, and the vacuum electrical feedthrough may be embedded in the lid. In the case of a process ring sensor, the shaft may extend up from a bottom chamber surface and intersect a plasma screen that is adjacent to the process ring. In such embodiments, the vacuum electrical feedthrough may be positioned within a port through the bottom chamber surface. In the case of an evacuation region sensor, the shaft may be inserted through a port through a chamber wall, and the vacuum electrical feedthrough may be outside the chamber wall. In some embodiments, an adapter may be fitted around portions of the sensor housing assembly in order to provide a hermetic seal along ports with any dimension.

In some embodiments, portions of the sensor assembly may be considered a consumable component. For example, the sensor module may be replaced after a certain period of time or after significant sensor drift is detected. The sensor housing assembly may be easily disassembled to allow for simple replacement. In a particular embodiment, the shaft may have a threaded end that screws into a main housing that is attached to the vacuum electrical feedthrough. As such, the shaft and other components attached to the shaft (e.g., the cap and the sensor module) may be removed and replaced by screwing a new shaft to the main housing. In other embodiments, the entire sensor assembly may be considered a consumable component, and the entire sensor assembly may be replaced after a certain period of time or after significant sensor drift is detected.

Providing capacitive sensor modules, such as those described herein, within a processing apparatus allows for chamber conditions to be monitored during the execution of various processing recipes, during transitions between substrates, during cleaning operations (e.g., ICC operations), during chamber validation, or during any other desired time. Furthermore, the architecture of the sensor modules disclosed herein allows for integration in many different locations. Such flexibility allows for many different components of a processing apparatus to be monitored simultaneously in order to provide enhanced abilities to determine the cause of chamber drift. For example, FIG. 11 provides a schematic illustrating a processing apparatus 1100 that includes the integration of capacitive sensor modules 1111 in various locations.

Figure 11:
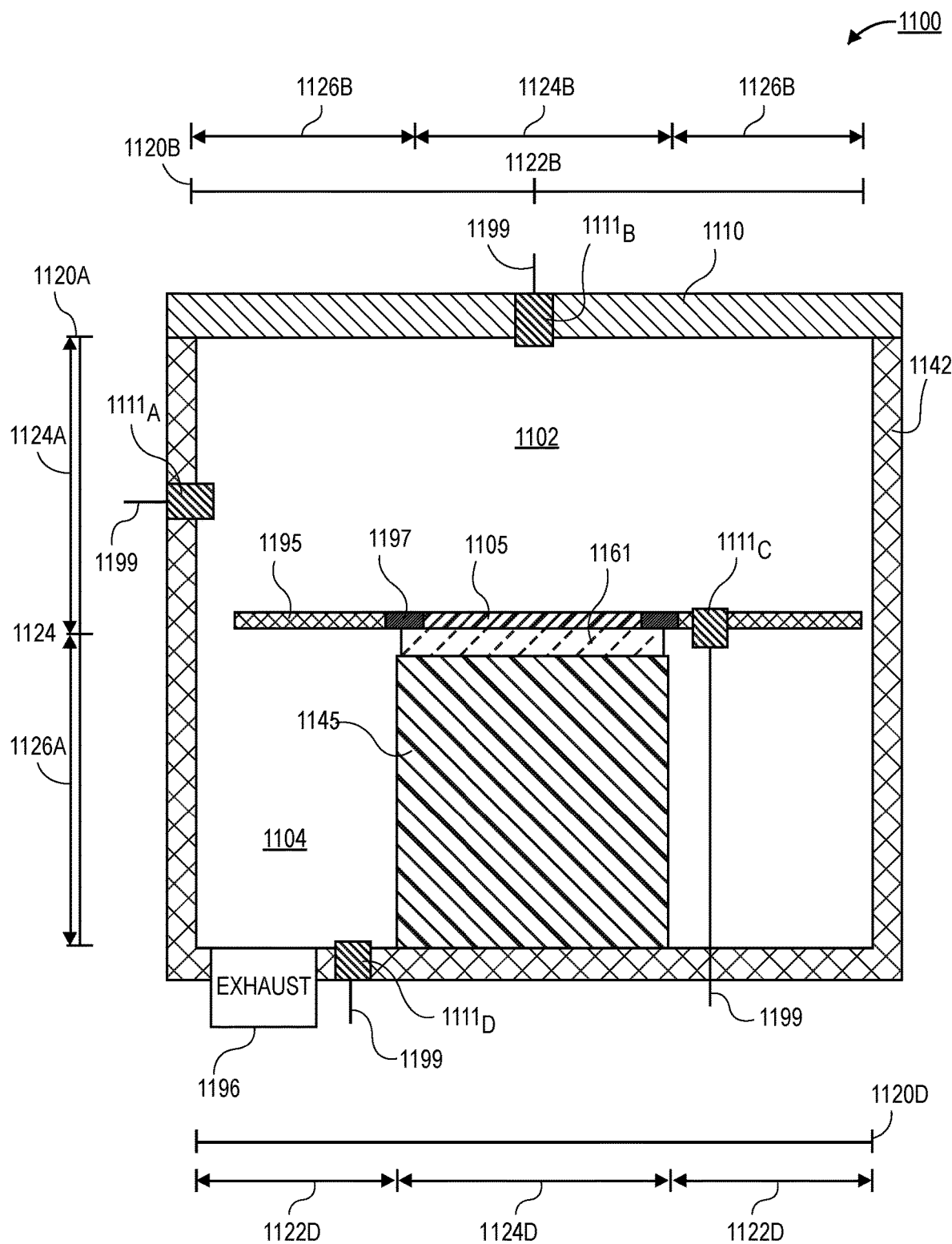
FIG. 11 provides a schematic illustrating a processing apparatus that includes the integration of capacitive sensor modules in various locations, in accordance with an embodiment of the present disclosure.

As shown, in FIG. 11, the processing apparatus 1100 may include a chamber 1142. A cathode liner 1145 may surround a lower electrode 1161. A substrate 1105 may be secured to the lower electrode 1161. A process ring 1197 may surround the substrate 1105, and a plasma screen 1195 may surround the process ring 1197. In an embodiment, a lid assembly 1110 may seal the chamber 1142. The chamber 1142 may include a processing region 1102 and an evacuation region 1104. The evacuation region 1104 may be proximate to an exhaust port 1196.

In some embodiments, a sidewall sensor module $1111_A$ may be located along a sidewall of the chamber 1142. In some embodiments, the sidewall sensor module $1111_A$ passes through the wall of the chamber 1142 and is exposed to the processing region 1102. In some embodiments, a lid sensor module $1111_B$ is integrated with the lid assembly 1110 and faces the processing region 1102. In some embodiments, a process ring sensor module $1111_C$ is positioned adjacent to the process ring 1197. For example, the process ring sensor module $1111_C$ may be integrated with the plasma screen 1195 that surrounds the process ring 1197. In yet another embodiment, an evacuation region sensor module $1111_D$ may be located in the evacuation region 1104. For example, the evacuation region sensor module $1111_D$ may pass through a bottom surface of the chamber 1142. As shown, each of the sensor modules 1111 includes an electrical lead 1199 that exits the chamber 1142. As such, real time monitoring with the sensor modules 1111 may be implemented.

In an embodiment, sidewall sensor module $1111_A$ is in a location 1120A along a side of chamber 1142. In one embodiment, sidewall sensor module $1111_A$ is in a location 1122A laterally adjacent to a substrate 1105 support region of the lower electrode 1161. In one embodiment, sidewall sensor module $1111_A$ is in a location 1124A vertically between a substrate 1105 support region of the lower electrode 1161 and the lid assembly 1110. In one embodiment, sidewall sensor module $1111_A$ is in a location 1126A vertically between a substrate 1105 support region of the lower electrode 1161 and a floor of the processing apparatus 1100.

In an embodiment, lid sensor module $1111_B$ is in a location 1120B along lid assembly 1110. In one embodiment, lid sensor module $1111_B$ is in a location 1122B coaxial with substrate 1105 support region of the lower electrode 1161. In one embodiment, lid sensor module $1111_B$ is in a location 1124B vertically over substrate 1105 support region of the lower electrode 1161. In one embodiment, lid sensor module $1111_B$ is in a location 1126B vertically over a region outside of substrate 1105 support region of the lower electrode 1161.

In an embodiment, process ring sensor module $1111_C$ is in an inner periphery of plasma screen 1195. In another embodiment, process ring sensor module $1111_C$ is in an outer periphery of plasma screen 1195.

In an embodiment, the evacuation region sensor module $1111_D$ is in a location 1120D along a bottom surface of the chamber 1142. In one embodiment, the evacuation region sensor module $1111_D$ is in a location 1122D vertically beneath a region outside of a substrate support region of the lower electrode 1161. In one embodiment, the evacuation region sensor module $1111_D$ is in a location 1124D vertically beneath a substrate support region of the lower electrode 1161.

In an embodiment, one or more of the capacitive sensor modules 1111 further includes a thermal sensor. In one such embodiment, the capacitive sensor module includes a capacitive sensor proximate a substrate processing region, and includes the thermal sensor distal from the substrate processing region. In another such embodiment, the capacitive sensor module includes a capacitive sensor proximate a substrate support region, and includes the thermal sensor distal from the substrate support region.

Figure 12A:
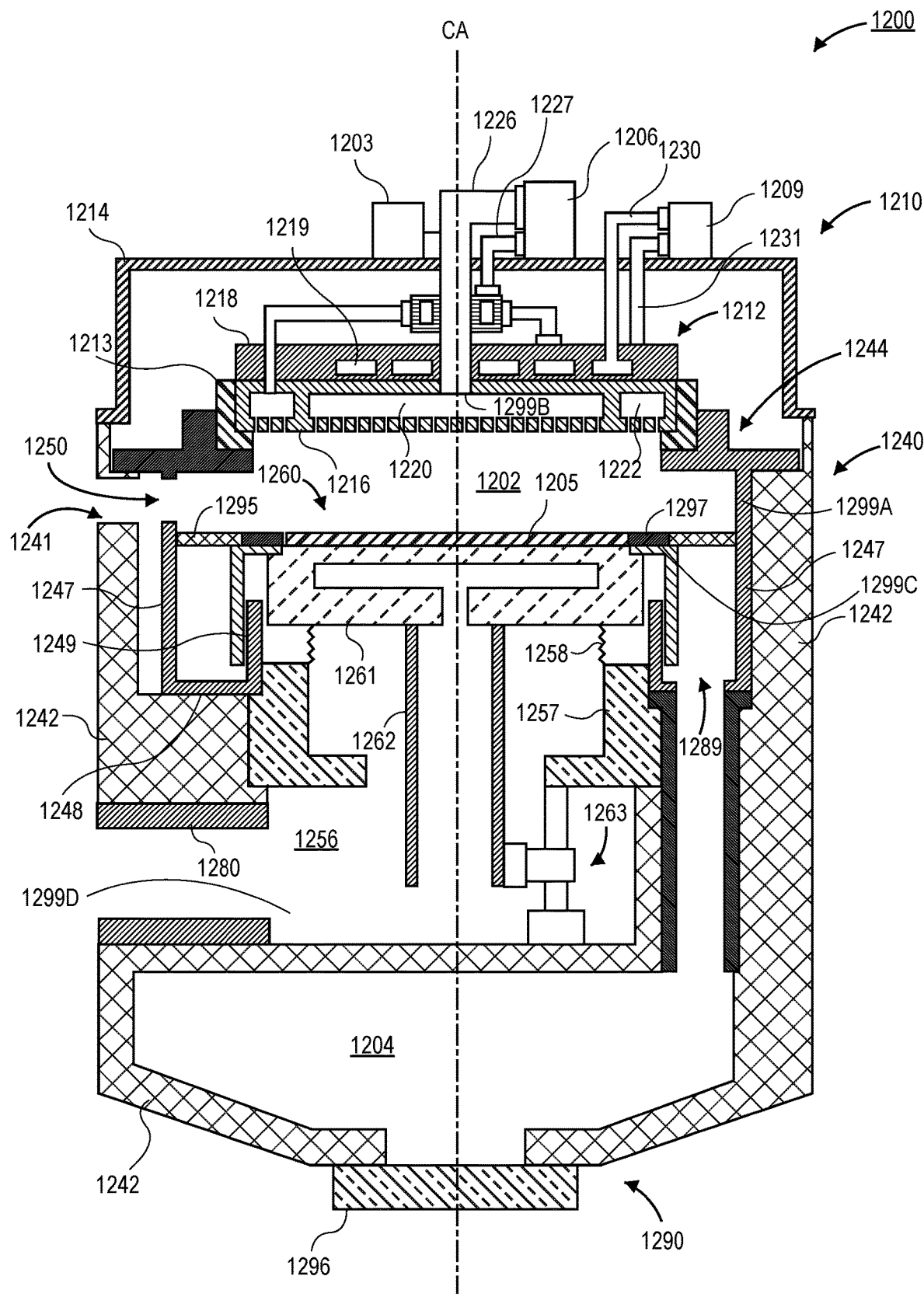
FIG. 12A is a schematic illustrating a cross-sectional view of a plasma processing apparatus that includes one or more sensor modules, in accordance with an embodiment of the present disclosure.

FIG. 12A is a schematic illustrating a cross-sectional view of a plasma processing apparatus 1200 that includes one or more sensor modules, such as those described herein according to an embodiment. The plasma processing apparatus 1200 may be a plasma etch chamber, a plasma enhanced chemical vapor deposition chamber, a physical vapor deposition chamber, a plasma treatment chamber, an ion implantation chamber, or other suitable vacuum processing chamber. As shown in FIG. 12A, the plasma processing apparatus 1200 generally includes a chamber lid assembly 1210, a chamber body assembly 1240, and an exhaust assembly 1290, which collectively enclose a processing region 1202 and an evacuation region 1204. In practice, processing gases are introduced into the processing region 1202 and ignited into a plasma using RF power. A substrate 1205 is positioned on a substrate support assembly 1260 and exposed to the plasma generated in the processing region 1202 to perform a plasma process on the substrate 1205, such as etching, chemical vapor deposition, physical vapor deposition, implantation, plasma annealing, plasma treating, abatement, or other plasma processes. Vacuum is maintained in the processing region 1202 by the exhaust assembly 1290, which removes spent processing gases and byproducts from the plasma process through the evacuation region 1204.

The lid assembly 1210 generally includes an upper electrode 1212 (or anode) isolated from and supported by the chamber body assembly 1240 and a chamber lid 1214 enclosing the upper electrode 1212. The upper electrode 1212 is coupled to an RF power source 1203 via a conductive gas inlet tube 1226. The conductive gas inlet tube 1226 is coaxial with a central axis of the chamber body assembly 1240 so that both RF power and processing gases are symmetrically provided. The upper electrode 1212 includes a showerhead plate 1216 attached to a heat transfer plate 1218. The showerhead plate 1216, the heat transfer plate 1218, and the gas inlet tube 1226 are all fabricated from an RF conductive material, such as aluminum or stainless steel.

The showerhead plate 1216 has a central manifold 1220 and one or more outer manifolds 1222 for distributing processing gasses into the processing region 102. The one or more outer manifolds 1222 circumscribe the central manifold 1220. The central manifold 1220 receives processing gases from a gas source 1206 through the gas inlet tube 1226, and the outer manifold(s) 1222 receives processing gases, which may be the same or a different mixture of gases received in the central manifold 1220, from the gas source 1206 through gas inlet tube(s) 1227. The dual manifold configuration of the showerhead plate 1216 allows improved control of the delivery of gases into the processing region 1202. The multi-manifold showerhead plate 116 enables enhanced center to edge control of processing results as opposed to conventional single manifold versions.

A heat transfer fluid is delivered from a fluid source 1209 to the heat transfer plate 1218 through a fluid inlet tube 1230. The fluid is circulated through one or more fluid channels 1219 disposed in the heat transfer plate 1218 and returned to the fluid source 1209 via a fluid outlet tube 1231. Suitable heat transfer fluids include water, water-based ethylene glycol mixtures, a perfluoropolyether (e.g., Galden® fluid), oil-based thermal transfer fluids, or similar fluids.

The chamber body assembly 1240 includes a chamber body 1242 fabricated from a conductive material resistant to processing environments, such as aluminum or stainless steel. The substrate support assembly 1260 is centrally disposed within the chamber body 1242 and positioned to support the substrate 1205 in the processing region 1202 symmetrically about the central axis (CA). The substrate support assembly 1260 may also support a process ring 1297 that surrounds the substrate 1205. The chamber body 1242 includes a ledge that supports an outer flange of an upper liner assembly 1244. The upper liner assembly 1244 may be constructed from a conductive, process compatible material, such as aluminum, stainless steel, and/or yttria (e.g., yttria coated aluminum). In practice, the upper liner assembly 1244 shields the upper portion of the chamber body 1242 from the plasma in the processing region 1202 and is removable to allow periodic cleaning and maintenance. An inner flange of the upper liner assembly 1244 supports the upper electrode 1212. An insulator 1213 is positioned between the upper liner assembly 1244 and the upper electrode 1212 to provide electrical insulation between the chamber body assembly 1240 and the upper electrode 1212.

The upper liner assembly 1244 includes an outer wall 1247 attached to the inner and outer flanges, a bottom wall 1248, and an inner wall 1249. The outer wall 1247 and inner wall 1249 are substantially vertical, cylindrical walls. The outer wall 1247 is positioned to shield chamber body 1242 from plasma in the processing region 1202, and the inner wall 1249 is positioned to at least partially shield the side of the substrate support assembly 1260 from plasma in the processing region 1202. The bottom wall 1248 joins the inner and outer walls (1249, 1247) except in certain regions where evacuation passages 1289 are formed.

The processing region 1202 is accessed through a slit valve tunnel 1241 disposed in the chamber body 1242 that allows entry and removal of the substrate 1205 into/from the substrate support assembly 1260. The upper liner assembly 1244 has a slot 1250 disposed there through that matches the slit valve tunnel 1241 to allow passage of the substrate 1205 there through. A door assembly (not shown) closes the slit valve tunnel 1241 and the slot 1250 during operation of the plasma processing apparatus.

The substrate support assembly 1260 generally includes lower electrode 1261 (or cathode) and a hollow pedestal 1262, the center of which the central axis (CA) passes through, and is supported by a central support member 1257 disposed in the central region 1256 and supported by the chamber body 1242. The central axis (CA) also passes through the center of the central support member 1257. The lower electrode 1261 is coupled to the RF power source 1203 through a matching network (not shown) and a cable (not shown) routed through the hollow pedestal 1262. When RF power is supplied to the upper electrode 1212 and the lower electrode 1261, an electrical field formed there between ignites the processing gases present in the processing region 1202 into a plasma.

The central support member 1257 is sealed to the chamber body 1242, such as by fasteners and O-rings (not shown), and the lower electrode 1261 is sealed to the central support member 1257, such as by a bellows 1258. Thus, the central region 1256 is sealed from the processing region 1202 and may be maintained at atmospheric pressure, while the processing region 1202 is maintained at vacuum conditions.

An actuation assembly 1263 is positioned within the central region 1256 and attached to the chamber body 1242 and/or the central support member 1257. The actuation assembly 1263 provides vertical movement of the lower electrode 161 relative to the chamber body 142, the central support member 1257, and the upper electrode 1212. Such vertical movement of the lower electrode 1261 within the processing region 1202 provides a variable gap between the lower electrode 1261 and the upper electrode 1212, which allows increased control of the electric field formed there between, in turn, providing greater control of the density in the plasma formed in the processing region 1202. In addition, since the substrate 1205 is supported by the lower electrode 1261, the gap between the substrate 1205 and the showerhead plate 1216 may also be varied, resulting in greater control of the process gas distribution across the substrate 1205.

In one embodiment, the lower electrode 1261 is an electrostatic chuck, and thus includes one or more electrodes (not shown) disposed therein. A voltage source (not shown) biases the one or more electrodes with respect to the substrate 1205 to create an attraction force to hold the substrate 1205 in position during processing. Cabling coupling the one or more electrodes to the voltage source is routed through the hollow pedestal 1262 and out of the chamber body 1242 through one of the plurality of access tubes 1280.

Figure 12B:
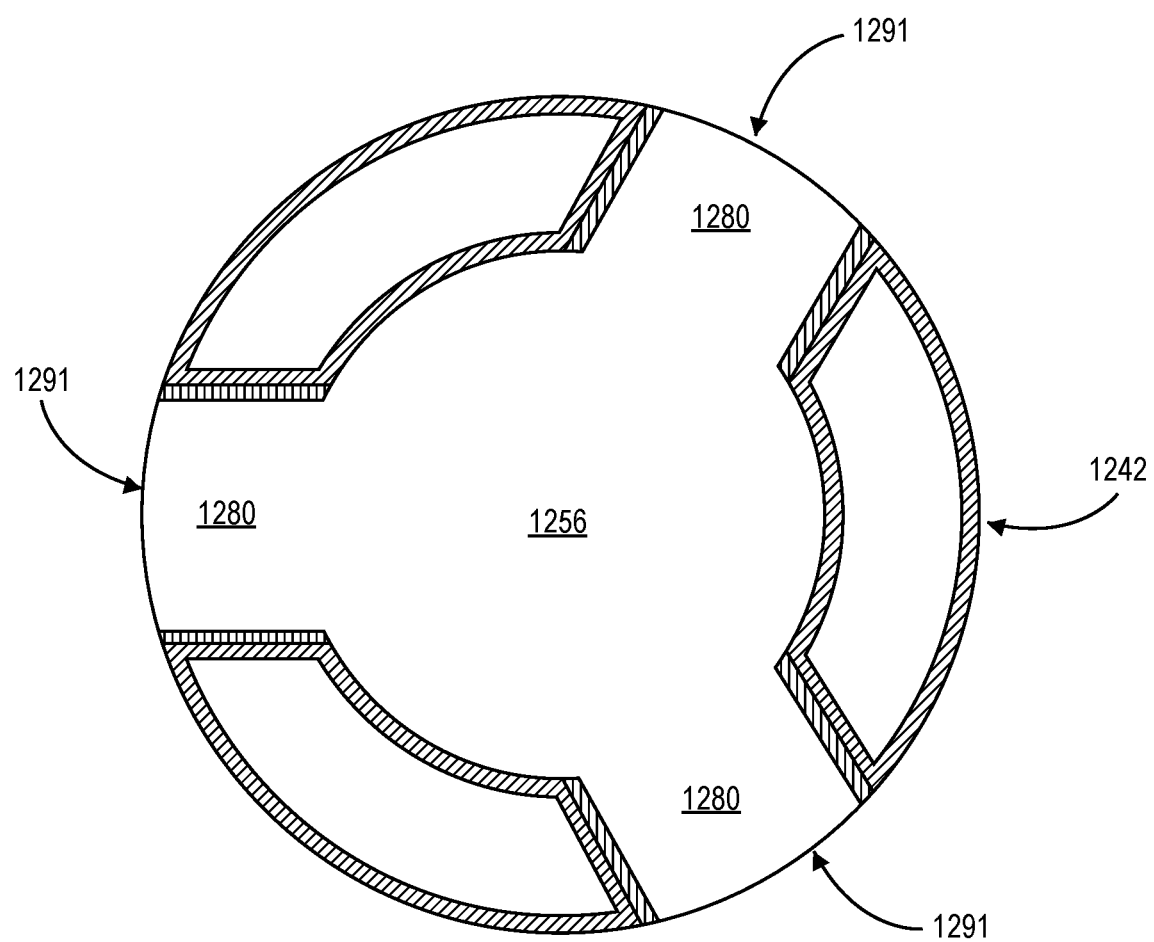
FIG. 12B is a schematic depiction of a layout of the access tubes within spokes of a chamber body assembly of the plasma processing apparatus of FIG. 12A, in accordance with an embodiment of the present disclosure.

FIG. 12B is a schematic depiction of the layout of the access tubes 1280 within spokes 1291 of the chamber body assembly 1240. The spokes 1291 and access tubes 1280 are symmetrically arranged about the central axis (CA) of the processing apparatus 1200 in a spoke pattern as shown. In the embodiment shown, three identical access tubes 1280 are disposed through the chamber body 1242 into the central region 1256 to facilitate supply of a plurality of tubing and cabling from outside of the chamber body 1242 to the lower electrode 1261. Each of the spokes 1291 are adjacent to an evacuation passage 1289 that fluidically couples the processing region 1202 above the central region 1256 to the evacuation region 1204 below the central region 1256. The symmetrical arrangement of the access tubes 1280 further provides electrical and thermal symmetry in the chamber body 1242, and particularly in the processing region 1202, in order to allow greater more uniform plasma formation in the processing region 1202 and improved control of the plasma density over the surface of the substrate 1205 during processing.

Similarly, the evacuation passages 1289 are positioned in the upper liner assembly 1244 symmetrically about the central axis (CA). The evacuation passages 1289 allow evacuation of gases from the processing region 1202 through the evacuation region 1204 and out of the chamber body 1242 through an exhaust port 1296. The exhaust port 1296 is centered about the central axis (CA) of the chamber body assembly 1240 such that the gases are evenly drawn through the evacuation passages 1289.

Referring again to FIG. 12A, a conductive, mesh liner 1295 is positioned on the upper liner assembly 1244. The mesh liner 1295 may be constructed from a conductive, process compatible material, such as aluminum, stainless steel, and/or yttria (e.g., yttria coated aluminum). The mesh liner 1295 may have a plurality of apertures (not shown) formed there through. The apertures may be positioned symmetrically about a center axis of the mesh liner 1295 to allow exhaust gases to be drawn uniformly there through, which in turn, facilitates uniform plasma formation in the processing region 1202 and allows greater control of the plasma density and gas flow in the processing region 1202. In one embodiment, the central axis of the mesh liner 1295 is aligned with the central axis (CA) of the chamber body assembly 1240.

The mesh liner 1295 may be electrically coupled to the upper liner assembly 1244. When an RF plasma is present within the processing region 1202, the RF current seeking a return path to ground may travel along the surface of the mesh liner 1295 to the outer wall 1247 of the upper liner assembly 1244. Thus, the annularly symmetric configuration of the mesh liner 1295 provides a symmetric RF return to ground and bypasses any geometric asymmetries of the upper liner assembly 1244.

In an embodiment, the one or more sensor modules may be located at various locations throughout the processing apparatus 1200. For example, a sensor module (or a portion of the sensor module) may be located in one or more locations, such as, but not limited to, along a sidewall of the chamber 1242, in the evacuation region 1204, adjacent to the process ring 1297 (e.g., integrated into the mesh liner 1295), or integrated with the lid assembly 1210. Accordingly, detection of various chamber conditions in multiple locations through the processing apparatus 1200 may be determined. The chamber conditions supplied by the one or more sensor modules may be used to modify one or more parameters, such as, for example, processing recipe parameters, cleaning schedules for the processing apparatus 1200, component replacement determinations, and the like.

In an embodiment, the processing apparatus 1200 includes a chamber wall capacitive sensor module, e.g., at a location 1299A. In an embodiment, the processing apparatus 1200 includes a chamber lid capacitive sensor module, e.g., at a location 1299B. In an embodiment, the processing apparatus 1200 includes a chamber floor or evacuation port capacitive sensor module within or adjacent to an evacuation port, e.g., at a location 1299D. In an embodiment, the processing apparatus 1200 includes a ring structure capacitive sensor module, e.g., at a location 1299C.

In an embodiment, the processing apparatus 1200 includes two or more different capacitive sensors selected from the group consisting of a chamber wall capacitive sensor module, a chamber lid capacitive sensor module, a chamber floor or evacuation port capacitive sensor module, a ring structure capacitive sensor module. In an embodiment, the processing apparatus 1200 includes two or more same capacitive sensors selected from the group consisting of a chamber wall capacitive sensor module, a chamber lid capacitive sensor module, a chamber floor or evacuation port capacitive sensor module, a ring structure capacitive sensor module.

In an embodiment, one or more of the chamber wall capacitive sensor module, the chamber lid capacitive sensor module, the chamber floor or evacuation port capacitive sensor module, and/or the ring structure capacitive sensor module further includes a thermal sensor. In one embodiment, such a chamber wall capacitive sensor module, chamber lid capacitive sensor module, or chamber floor or evacuation port capacitive sensor module includes a capacitive sensor proximate the processing region 1202, and includes the thermal sensor distal from the processing region 1202. In one embodiment, the ring structure capacitive sensor module includes a capacitive sensor proximate a substrate 1205 support region, and includes the thermal sensor distal from the substrate 1205 support region.

While the processing apparatus 1200 in FIGS. 12A and 12B provides a specific example of a tool that may benefit from the inclusion of sensor modules such as those disclosed herein, it is to be appreciated that embodiments are not limited to the particular construction of FIGS. 12A and 12B. That is, many different plasma chamber constructions, such as, but not limited to those used in the microelectronic fabrication industry, may also benefit from the integration of sensor modules, such as those disclosed herein.

Figure 13:
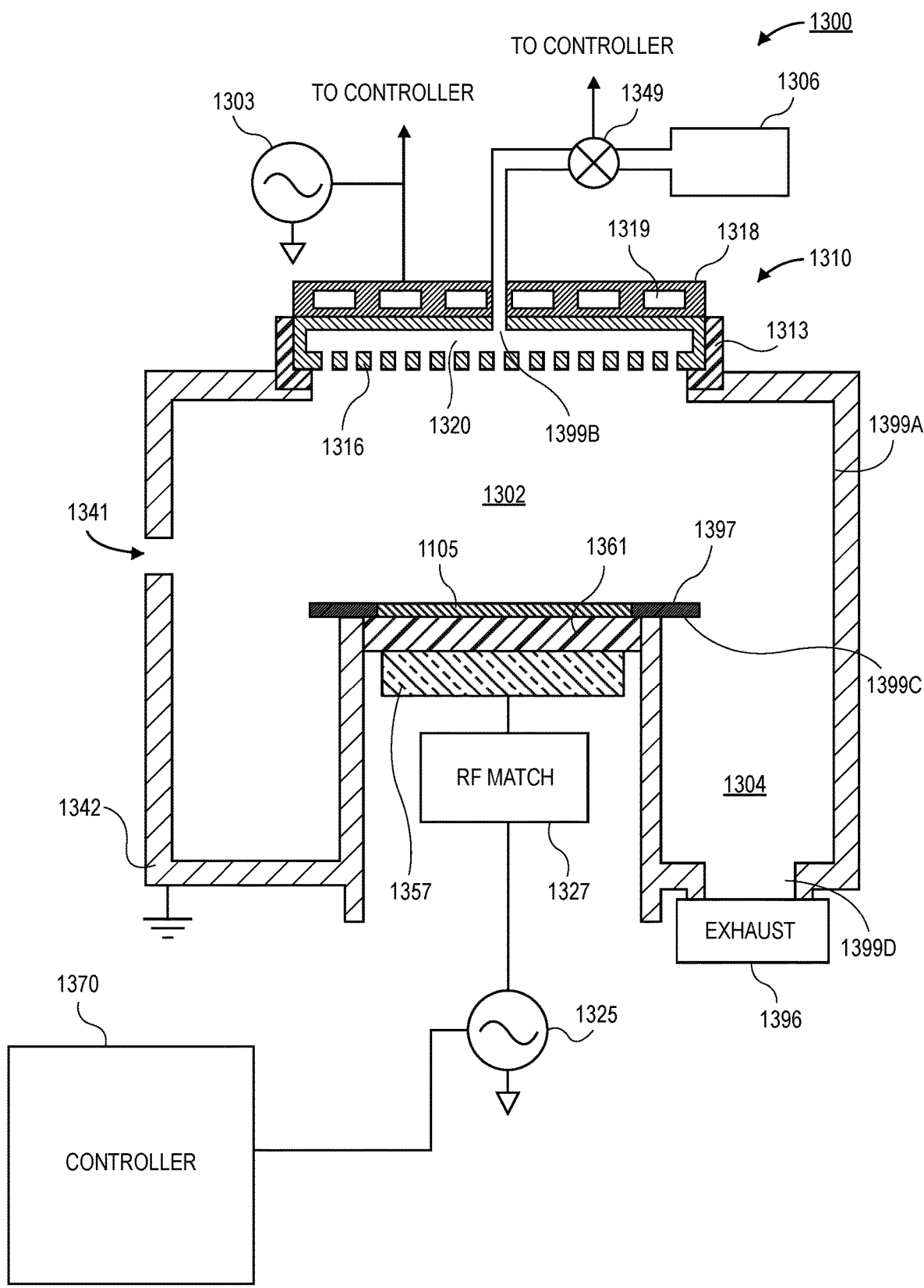
FIG. 13 is a cross-sectional illustration of a processing apparatus that can include one or more capacitive sensor modules, in accordance with an embodiment of the present disclosure.

For example, FIG. 13 is a cross-sectional illustration of a processing apparatus 1300 that can include one or more capacitive sensor modules such as those described above, in accordance with an embodiment. The plasma processing apparatus 100 may be a plasma etch chamber, a plasma enhanced chemical vapor deposition chamber, a physical vapor deposition chamber, a plasma treatment chamber, an ion implantation chamber, or other suitable vacuum processing chamber.

Processing apparatus 1300 includes a grounded chamber 1342. In some instances, the chamber 1342 may also include a liner (not shown) to protect the interior surfaces of the chamber 1342. The chamber 1342 may include a processing region 1302 and an evacuation region 1304. The chamber 1342 may be sealed with a lid assembly 1310. Process gases are supplied from one or more gas sources 1306 through a mass flow controller 1349 to the lid assembly 1310 and into the chamber 1305. An exhaust port 1396 proximate to the evacuation region 1304 may maintain a desired pressure within the chamber 1342 and remove byproducts from processing in the chamber 1342.

The lid assembly 1310 generally includes an upper electrode including a showerhead plate 1316 and a heat transfer plate 1318. The lid assembly 1310 is isolated from the chamber 1342 by an insulating layer 1313. The upper electrode is coupled to a source RF generator 1303 through a match (not shown). Source RF generator 1303 may have a frequency between 100 and 180 MHz, for example, and in a particular embodiment, is in the 162 MHz band. The gas from the gas source 1306 enters into a manifold 1320 within the showerhead plate 1316 and exits into processing region 1302 of the chamber 1342 through openings into the showerhead plate 1316. In an embodiment, the heat transfer plate 1318 includes channels 1319 through which heat transfer fluid is flown. The showerhead plate 1316 and the heat transfer plate 1318 are fabricated from an RF conductive material, such as aluminum or stainless steel. In certain embodiments, a gas nozzle or other suitable gas distribution assembly is provided for distribution of process gases into the chamber 1342 instead of (or in addition to) the showerhead plate 1316.

The processing region 1302 may include a lower electrode 1361 onto which a substrate 1305 is secured. Portions of a process ring 1397 that surrounds the substrate 1305 may also be supported by the lower electrode 1361. The substrate 1305 may be inserted into (or extracted from) the chamber 1342 through a slit valve tunnel 1341 through the chamber 1342. A door for the slit valve tunnel 1341 is omitted for simplicity. The lower electrode 1361 may be an electrostatic chuck. The lower electrode 1361 may be supported by a support member 1357. In an embodiment, lower electrode 1361 may include a plurality of heating zones, each zone independently controllable to a temperature set point. For example, lower electrode 1361 may include a first thermal zone proximate a center of substrate 1305 and a second thermal zone proximate to a periphery of substrate 1305. Bias power RF generator 1325 is coupled to the lower electrode 1361 through a match 1327. Bias power RF generator 1325 provides bias power, if desired, to energize the plasma. Bias power RF generator 1325 may have a low frequency between about 2 MHz to 60 MHz for example, and in a particular embodiment, is in the 13.56 MHz band.

In an embodiment, the one or more sensor modules may be located at various locations throughout the processing apparatus 1300. For example, a sensor module (or a portion of the sensor module) may be located in one or more locations, such as, but not limited to, at location 1399A along a sidewall of the chamber 1342, at a location 1399D near or in the evacuation region 1304, at a location 1399C adjacent to or within the process ring 1397, and/or integrated with the lid assembly 1310 such as at a location 1399B. Accordingly, detection of various chamber conditions in multiple locations through the processing apparatus 1300 may be determined. The chamber conditions supplied by the one or more sensor modules may be used to modify one or more parameters, such as, for example, processing recipe parameters, cleaning schedules for the processing apparatus 1300, component replacement determinations, and the like.

Figure 14:
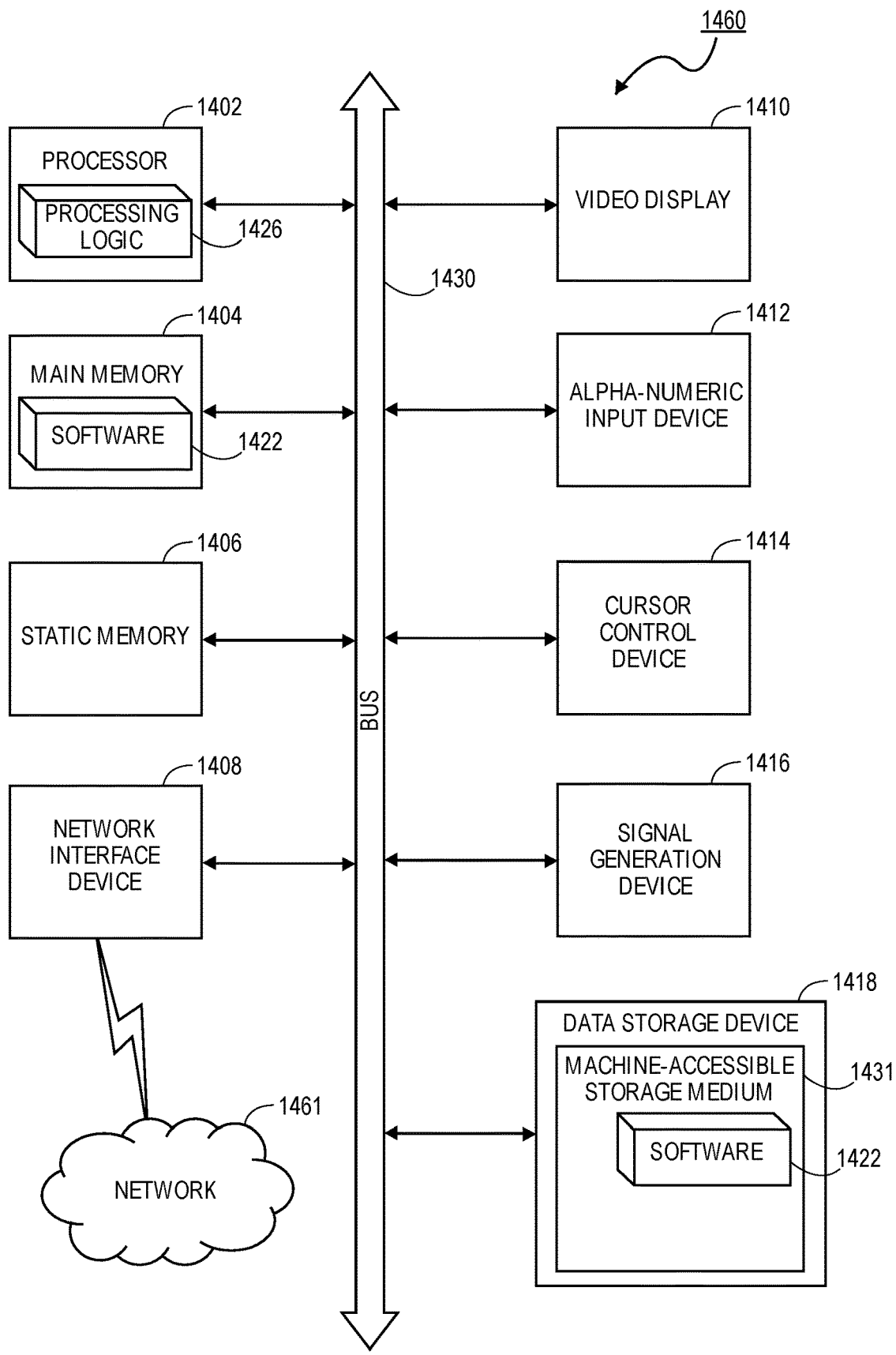
FIG. 14 illustrates a block diagram of an exemplary computer system of a processing tool, in accordance with an embodiment of the present disclosure.

Referring now to FIG. 14, a block diagram of an exemplary computer system 1460 of a processing tool is illustrated in accordance with an embodiment. In an embodiment, computer system 1460 is coupled to and controls processing in the processing tool. The computer system 1460 may be communicatively coupled to one or more sensor modules, such as those disclosed herein. The computer system 1460 may utilize outputs from the one or more sensor modules in order to modify one or more parameters, such as, for example, processing recipe parameters, cleaning schedules for the processing tool, component replacement determinations, and the like.

Computer system 1460 may be connected (e.g., networked) to other machines in a Local Area Network (LAN), an intranet, an extranet, or the Internet. Computer system 1460 may operate in the capacity of a server or a client machine in a client-server network environment, or as a peer machine in a peer-to-peer (or distributed) network environment. Computer system 1460 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 1460, the term "machine" shall also be taken to include any collection of machines (e.g., computers) that individually or jointly execute a set (or multiple sets) of instructions to perform any one or more of the methodologies described herein.

Computer system 1460 may include a computer program product, or software 1422, having a non-transitory machine-readable medium having stored thereon instructions, which may be used to program computer system 1460 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 1460 includes a system processor 1402, a main memory 1404 (e.g., read-only memory (ROM), flash memory, dynamic random access memory (DRAM) such as synchronous DRAM (SDRAM) or Rambus DRAM (RDRAM), etc.), a static memory 1406 (e.g., flash memory, static random access memory (SRAM), etc.), and a secondary memory 1418 (e.g., a data storage device), which communicate with each other via a bus 1430.

System processor 1402 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 1402 may also be one or more special-purpose processing devices such as an application specific integrated circuit (ASIC), a field programmable gate array (FPGA), a digital signal system processor (DSP), network system processor, or the like. System processor 1402 is configured to execute the processing logic 1426 for performing the operations described herein.

The computer system 1460 may further include a system network interface device 1408 for communicating with other devices or machines. The computer system 1460 may also include a video display unit 1410 (e.g., a liquid crystal display (LCD), a light emitting diode display (LED), or a cathode ray tube (CRT)), an alphanumeric input device 1412 (e.g., a keyboard), a cursor control device 1414 (e.g., a mouse), and a signal generation device 1416 (e.g., a speaker).

The secondary memory 1418 may include a machine-accessible storage medium 1431 (or more specifically a computer-readable storage medium) on which is stored one or more sets of instructions (e.g., software 1422) embodying any one or more of the methodologies or functions described herein. The software 1422 may also reside, completely or at least partially, within the main memory 1404 and/or within the system processor 1402 during execution thereof by the computer system 1460, the main memory 1404 and the system processor 1402 also constituting machine-readable storage media. The software 1422 may further be transmitted or received over a network 1461 via the system network interface device 1408. In an embodiment, the network interface device 1408 may operate using RF coupling, optical coupling, acoustic coupling, or inductive coupling.

While the machine-accessible storage medium 1431 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

Thus, embodiments of the present disclosure include capacitive sensors and capacitive sensing locations for plasma chamber condition monitoring.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: A plasma chamber monitoring system includes a plurality of capacitive sensors, a capacitance digital converter, and an applied process server coupled to the capacitance digital converter, the applied process server including a system software. The capacitance digital converter includes an isolation interface coupled to the plurality of capacitive sensors, a power supply coupled to the isolation interface, a field-programmable gate-array firmware coupled to the isolation interface, and an application-specific integrated circuit coupled to the field-programmable gate-array firmware.

Example embodiment 2: The plasma chamber monitoring system of example embodiment 1, wherein the application-specific integrated circuit of the capacitance digital converter is an etherCAT application-specific integrated circuit.

Example embodiment 3: The plasma chamber monitoring system of example embodiment 2, wherein the etherCAT application-specific integrated circuit provides for seamless integration of the system software and control of multiple ones of the plurality of capacitive sensors simultaneously.

Example embodiment 4: The plasma chamber monitoring system of example embodiment 2 or 3, wherein the etherCAT application-specific integrated circuit initializes and calibrates individual ones of the plurality of capacitive sensors.

Example embodiment 5: The plasma chamber monitoring system of example embodiment 1, 2, 3 or 4, wherein the applied process server synchronizes capacitance sensor data from the plurality of capacitive sensors with a process recipe.

Example embodiment 6: The plasma chamber monitoring system of example embodiment 1, 2, 3, 4 or 5, wherein the field-programmable gate-array firmware of the capacitance digital converter provides for deterministic timing and simultaneous communication with multiple ones of the plurality of capacitive sensors.

Example embodiment 7: The plasma chamber monitoring system of example embodiment 1, 2, 3, 4, 5 or 6, wherein individual ones of the plurality of capacitive sensors are coupled in parallel to the isolation interface of the capacitance digital converter.

Example embodiment 8: The plasma chamber monitoring system of example embodiment 1, 2, 3, 4, 5, 6 or 7, wherein individual ones of the plurality of capacitive sensors are each coupled to the isolation interface of the capacitance digital converter by an interconnect including an inter-integrated circuit bus and a power supply line.

Example embodiment 9: The plasma chamber monitoring system of example embodiment 1, 2, 3, 4, 5, 6, 7 or 8, wherein one or more of the plurality of sensors is for locating at a chamber wall of a plasma chamber.

Example embodiment 10: The plasma chamber monitoring system of example embodiment 1, 2, 3, 4, 5, 6, 7, 8 or 9, wherein one or more of the plurality of sensors is for locating at a chamber lid of a plasma chamber.

Example embodiment 11: The plasma chamber monitoring system of example embodiment 1, 2, 3, 4, 5, 6, 7, 8, 9 or 10, wherein one or more of the plurality of sensors is for locating at an evacuation region of a plasma chamber.

Example embodiment 12: The plasma chamber monitoring system of example embodiment 1, 2, 3, 4, 5, 6, 7, 8, 9, 10 or 11, wherein one or more of the plurality of sensors is for locating at a process ring within a plasma chamber.

Example embodiment 13: An interconnect for a plasma chamber monitoring system includes a first connector for coupling to a capacitance digital converter of a capacitive sensor module, a second connector for coupling to an electronic and an external power supply, and a shielded cable coupled to and between the first connector and the second connector. The shielded cable includes a shielding metal for physically connecting the interconnect to a frame of a plasma chamber, a power supply line housed within the shielding metal, a ground line housed within the shielding metal, and one or more communication lines housed within the shielding metal.

Example embodiment 14: The interconnect of example embodiment 13, wherein the power supply line housed within the shielding metal is a 3-4 Volt power supply line.

Example embodiment 15: The interconnect of example embodiment 13 or 14, wherein each of the one or more communication lines housed within the shielding metal is or includes an inter-integrated circuit bus.

Example embodiment 16: The interconnect of example embodiment 13, 14 or 15, wherein the ground line housed within the shielding metal provides a common ground for the capacitive sensor module and the electronic.

Example embodiment 17: The interconnect of example embodiment 13, 14, 15 or 16, wherein the one or more communication lines housed within the shielding metal synchronize sensor data clocking.

Example embodiment 18: The interconnect of example embodiment 13, 14, 15, 16 or 17, wherein a sensor of the capacitive sensor module is for locating at a chamber wall of a plasma chamber.

Example embodiment 19: The interconnect of example embodiment 13, 14, 15, 16, 17 or 18, wherein a sensor of the capacitive sensor module is for locating at a chamber lid of a plasma chamber.

Example embodiment 20: The interconnect of example embodiment 13, 14, 15, 16, 17, 18 or 19, wherein a sensor of the capacitive sensor module is for locating at an evacuation region of a plasma chamber.

Example embodiment 21: The interconnect of example embodiment 13, 14, 15, 16, 17, 18, 19 or 20, wherein a sensor of the capacitive sensor module is for locating at a process ring within a plasma chamber.

Example embodiment 22: A method of integrating data for plasma chamber condition monitoring includes streaming data from a capacitive sensor module to a data server. The data includes capacitance data and temperature data. The method also includes collecting the data on an applied process server. The method also includes correlating the data to one or more process recipe operations. The method also includes synchronizing the capacitive sensor module with the one or more process recipe operations.

Example embodiment 23: The method of example embodiment 22, further including, subsequent to collecting the data on the applied process server and prior to correlating the data to one or more process recipe operations, performing data processing and parametric extraction.

Example embodiment 24: The method of example embodiment 23, wherein performing the data processing includes filtering the data and denoising the data.

Example embodiment 25: The method of example embodiment 24, wherein filtering the data and denoising the data includes using a moving average approach.

Example embodiment 26: The method of example embodiment 23, 24 or 25, wherein performing the data processing and the parametric extraction includes regression modeling of the data.

Example embodiment 27: The method of example embodiment 22, 23, 24, 25 or 26, further including monitoring one or more parameters of the one or more process recipe operations with the capacitive sensor module.

Example embodiment 28: The method of example embodiment 27, further including determining a clean/dirty status for a plasma chamber based on the monitoring of the one or more parameters of the one or more process recipe operations with the capacitive sensor module.

Example embodiment 29: The method of example embodiment 22, 23, 24, 25, 26, 27 or 28, wherein the plasma chamber condition monitoring is performed at a chamber wall of a plasma chamber.

Example embodiment 30: The method of example embodiment 22, 23, 24, 25, 26, 27, 28 or 29, wherein the plasma chamber condition monitoring is performed at a chamber lid of a plasma chamber.

Example embodiment 31: The method of example embodiment 22, 23, 24, 25, 26, 27, 28, 29 or 30, wherein the plasma chamber condition monitoring is performed at an evacuation region of a plasma chamber.

Example embodiment 32: The method of example embodiment 22, 23, 24, 25, 26, 27, 28, 29, 30 or 31, wherein the plasma chamber condition monitoring is performed at a process ring within a plasma chamber.

What is claimed is:

1. An interconnect for a plasma chamber monitoring system, the interconnect comprising:
    a first connector for coupling to a capacitance digital converter of a capacitive sensor module;
    a second connector for coupling to an electronics plugin module and an external power supply;
    a shielded cable coupled to and between the first connector and the second connector, the shielded cable comprising:
        a shielding metal for physically connecting the interconnect to a frame of a plasma chamber;
        a power supply line housed within the shielding metal;
        a ground line housed within the shielding metal; and
        one or more communication lines housed within the shielding metal.

2. The interconnect of claim 1, wherein the power supply line housed within the shielding metal is a 3-4 Volt power supply line.

3. The interconnect of claim 1, wherein each of the one or more communication lines housed within the shielding metal is or includes an inter-integrated circuit bus.

4. The interconnect of claim 1, wherein the ground line housed within the shielding metal provides a common ground for the capacitive sensor module and the electronic.

5. The interconnect of claim 1, wherein the one or more communication lines housed within the shielding metal synchronize sensor data clocking.

6. A system, comprising:
    a plasma chamber; and
    a plasma chamber monitoring system coupled to the plasma chamber, the plasma chamber monitoring system comprising an interconnect, the interconnect comprising:
        a first connector for coupling to a capacitance digital converter of a capacitive sensor module;
        a second connector for coupling to an electronics plugin module and an external power supply; and
        a shielded cable coupled to and between the first connector and the second connector, the shielded cable comprising:
            a shielding metal for physically connecting the interconnect to a frame of a plasma chamber;
            a power supply line housed within the shielding metal;
            a ground line housed within the shielding metal; and
            one or more communication lines housed within the shielding metal.

7. The system of claim 6, wherein the power supply line housed within the shielding metal is a 3-4 Volt power supply line.

8. The system of claim 6, wherein each of the one or more communication lines housed within the shielding metal is or includes an inter-integrated circuit bus.

9. The system of claim 6, wherein the ground line housed within the shielding metal provides a common ground for the capacitive sensor module and the electronic.

10. The system of claim 6, wherein the one or more communication lines housed within the shielding metal synchronize sensor data clocking.

* * * * *